(12) United States Patent
Chang et al.

(10) Patent No.: US 11,557,338 B2
(45) Date of Patent: *Jan. 17, 2023

(54) NON-VOLATILE MEMORY WITH MULTI-LEVEL CELL ARRAY AND ASSOCIATED PROGRAM CONTROL METHOD

(71) Applicant: eMemory Technology Inc., Hsin-Chu (TW)

(72) Inventors: Chia-Fu Chang, Hsinchu County (TW); Wei-Ming Ku, Hsinchu County (TW); Ying-Je Chen, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 12 days.

This patent is subject to a terminal disclaimer.

(21) Appl. No.: 17/319,127

(22) Filed: May 13, 2021

(65) Prior Publication Data

US 2022/0115063 A1 Apr. 14, 2022

Related U.S. Application Data

(60) Provisional application No. 63/090,765, filed on Oct. 13, 2020.

(51) Int. Cl.
| | |
|---|---|
| *G11C 11/34* | (2006.01) |
| *G11C 11/56* | (2006.01) |
| *G11C 16/10* | (2006.01) |
| *G11C 16/34* | (2006.01) |
| *G11C 16/04* | (2006.01) |
| *H02M 3/07* | (2006.01) |
| *G11C 16/30* | (2006.01) |

(52) U.S. Cl.
CPC ...... *G11C 11/5628* (2013.01); *G11C 16/0408* (2013.01); *G11C 16/10* (2013.01); *G11C 16/3459* (2013.01); *H02M 3/07* (2013.01); *G11C 16/30* (2013.01)

(58) Field of Classification Search
CPC . G11C 11/5628; G11C 16/10; G11C 16/3459; G11C 16/0408
See application file for complete search history.

(56) References Cited

U.S. PATENT DOCUMENTS 11,170,861 B1 * 11/2021 Chang .................... G11C 16/10

* cited by examiner

*Primary Examiner* — Uyen Smet
(74) *Attorney, Agent, or Firm* — WPAT, PC

(57) ABSTRACT

A non-volatile memory includes a cell array, a current supply circuit, a path selecting circuit, a verification circuit and a control circuit. During a sample period of a verification action, the control circuit controls the current supply circuit to provide n M-th reference currents to the verification circuit and convert the n M-th reference currents into n reference voltages. During a verification period of the verification action, the control circuit controls n multi-level memory cells of a selected row of the cell array to generate n cell currents to the verification circuit and convert the n cell currents into n sensed voltages. The n verification devices generate the n verification signals according to the reference voltages and the sensed voltages. Accordingly, the control circuit judges whether the n multi-level memory cells have reached an M-th storage state.

18 Claims, 12 Drawing Sheets

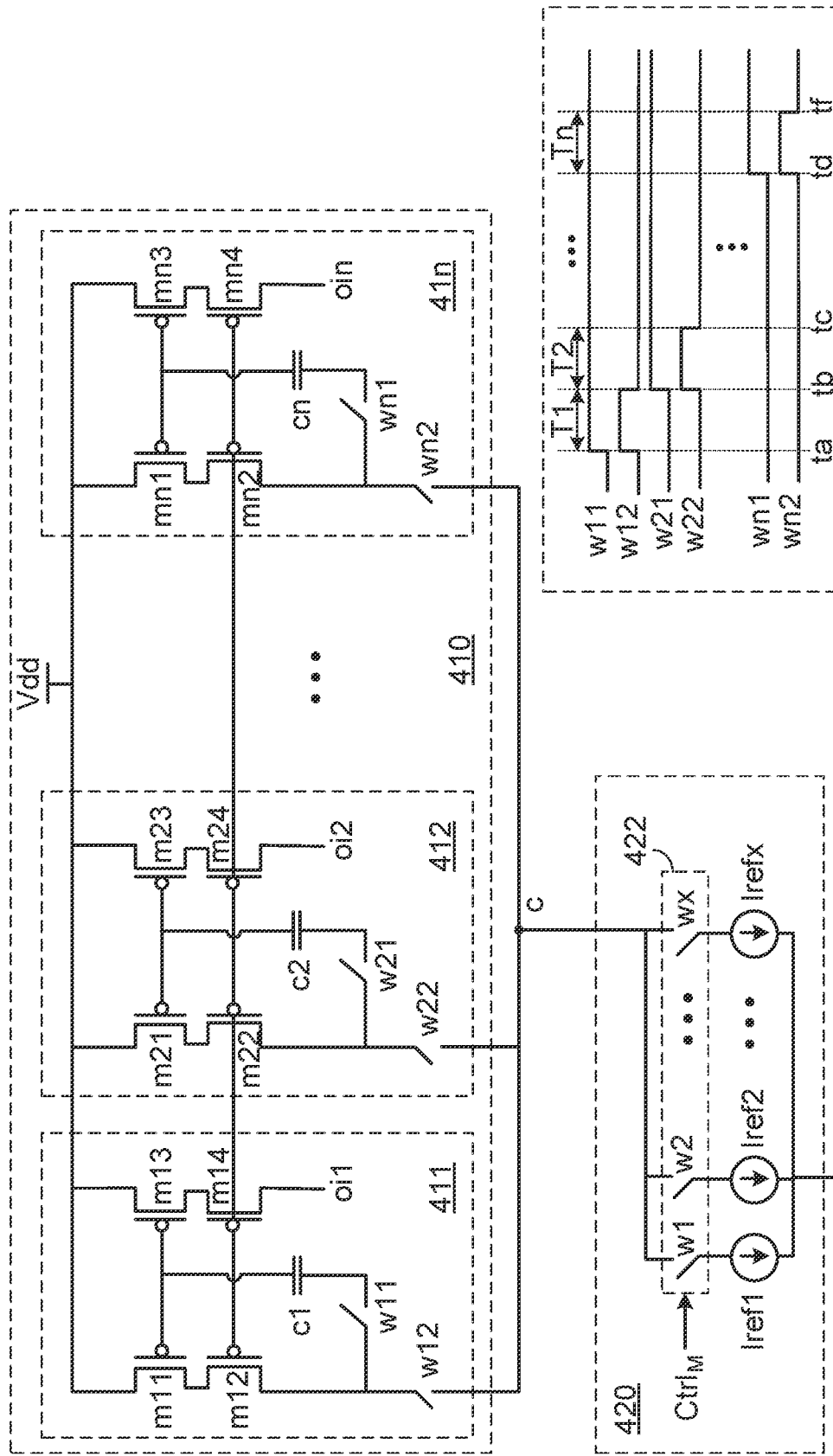

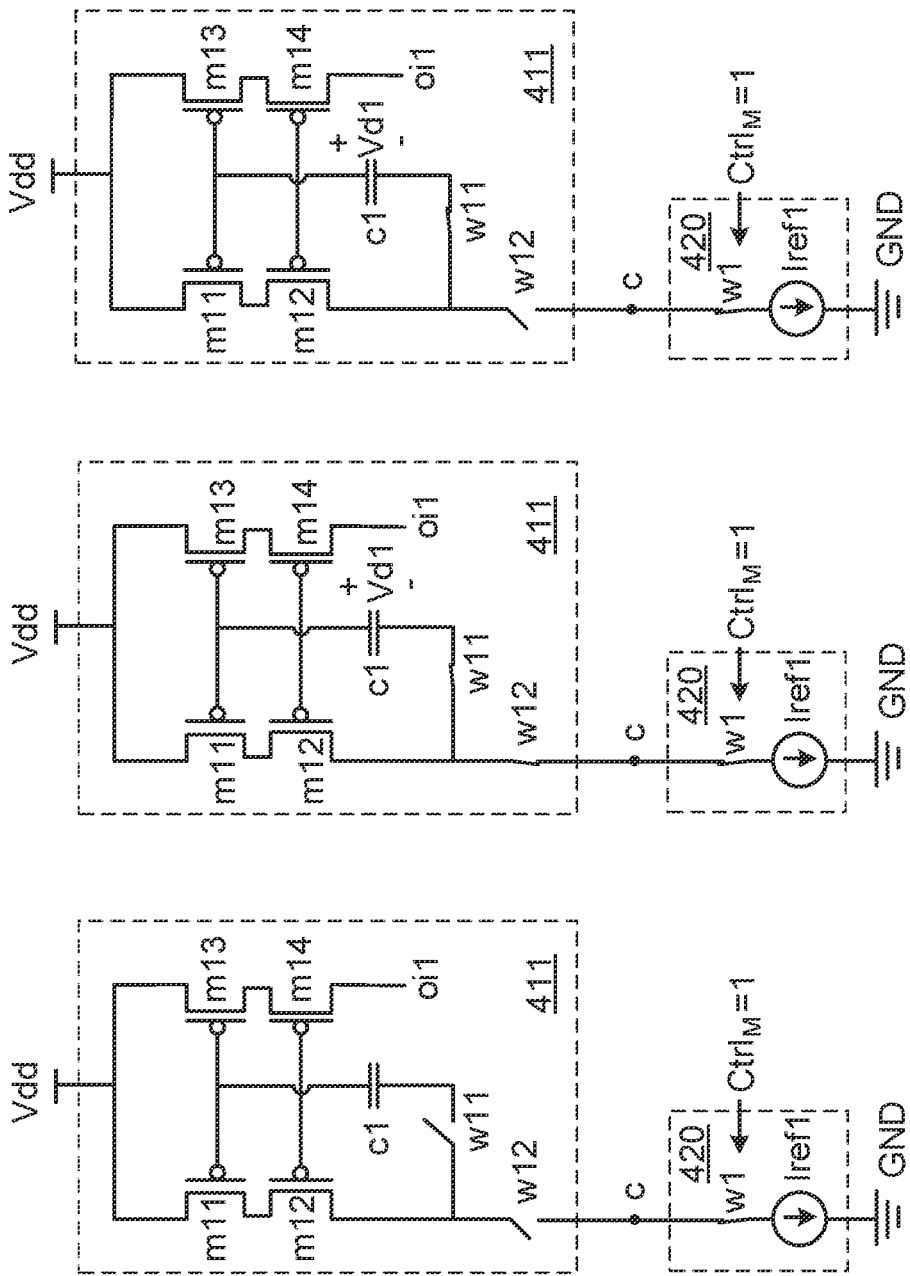

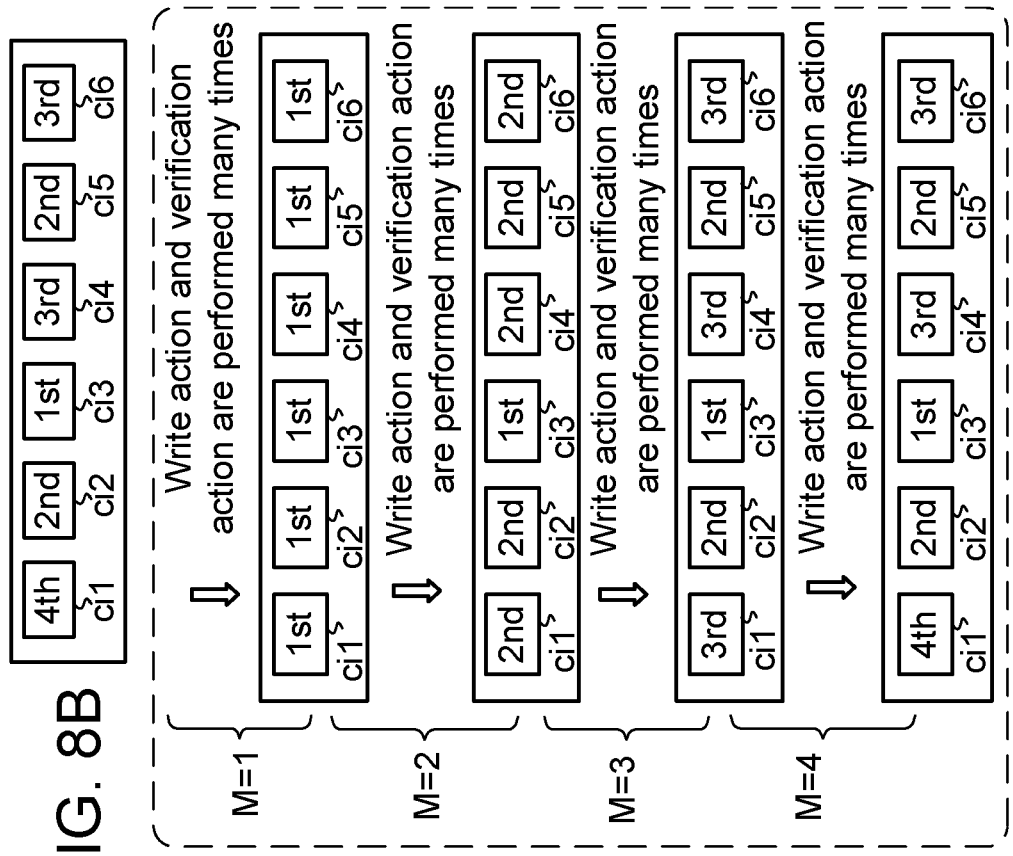
FIG. 8B
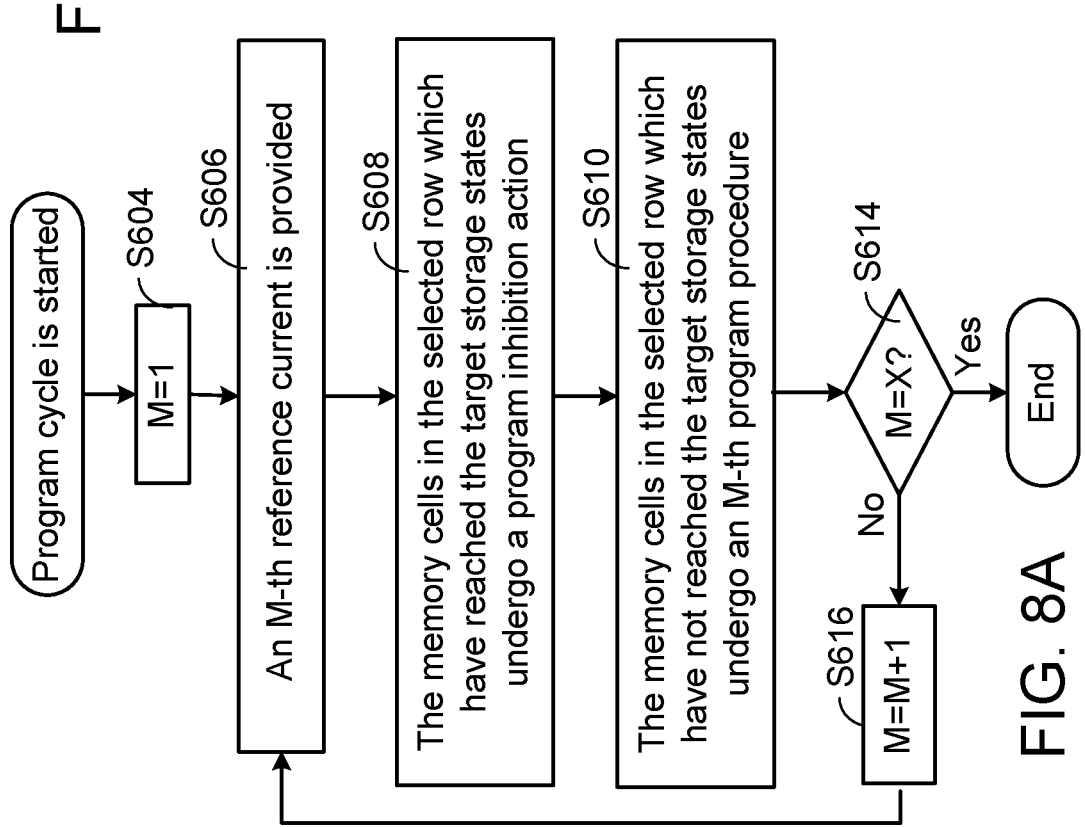
FIG. 8C
FIG. 8A

NON-VOLATILE MEMORY WITH MULTI-LEVEL CELL ARRAY AND ASSOCIATED PROGRAM CONTROL METHOD

This application claims the benefit of U.S. provisional application Ser. No. 63/090,765, filed Oct. 13, 2020, the subject matter of which is incorporated herein by reference.

FIELD OF THE INVENTION

The present invention relates to a non-volatile memory and an associated control method, and more particularly to a non-volatile memory with a multi-level cell array and an associated program control method.

BACKGROUND OF THE INVENTION

As is well known, a non-volatile memory is able to continuously retain data after the supplied power is interrupted. Consequently, the non-volatile memory is widely applied to a variety of electronic devices. Generally, the non-volatile memories are classified into a one-time programmable non-volatile memory (also referred as an OTP non-volatile memory) and a multi-time programmable non-volatile memory (also referred as an MTP non-volatile memory). The memory cells of the OTP non-volatile memory are OTP memory cells. The memory cells of the MTP non-volatile memory are MTP memory cells. Hereinafter, the circuitry structures of some types of non-volatile memory cells will be illustrated with reference to FIGS. 1A-1E.

FIG. 1A is a schematic circuit diagram illustrating an OTP non-volatile memory cell. As shown in FIG. 1A, the OTP non-volatile memory cell c1 comprises a floating gate transistor F and a switching transistor M. The first terminal of the OTP non-volatile memory cell c1 is connected with a source line SL. The second terminal of the OTP non-volatile memory cell c1 is connected with a bit line BL. The control terminal of the OTP non-volatile memory cell c1 is connected with a word line WL.

Please refer to FIG. 1A again. The first source/drain terminal of the switching transistor M is connected with the source line SL. The gate terminal of the switching transistor M is connected with the word line WL. The first source/drain terminal of the floating gate transistor F is connected with the second source/drain terminal of the switching transistor M. The second source/drain terminal of the floating gate transistor F is connected with the bit line BL.

For writing the OTP non-volatile memory cell c1, proper bias voltages are provided to the OTP non-volatile memory cell c1. Consequently, the OTP non-volatile memory cell c1 undergoes a program action, or the OTP non-volatile memory cell c1 undergoes a program inhibition action. During the program action of the OTP non-volatile memory cell c1, hot carriers are injected into the floating gate of the floating gate transistor F. During the program inhibition action, hot carriers are not injected into the floating gate of the floating gate transistor F. Moreover, the hot carriers are electrons.

For example, when the program action is performed on the OTP non-volatile memory cell c1, a program voltage is provided to the source line SL, an on voltage is provided to the word line WL, and a ground voltage is provided to the bit line BL. Consequently, the hot carriers are injected into the floating gate through a channel region of the floating gate transistor F. Whereas, when the program inhibition action is performed on the OTP non-volatile memory cell c1, the program voltage is provided to the source line SL, the on voltage is provided to the word line WL, and the bit line BL is in a floating state. Consequently, the hot carriers cannot be injected into the floating gate of the floating gate transistor F. In some situations, the bit line BL is not in the floating state. When the program inhibition action is performed on the OTP non-volatile memory cell c1, the program voltage is provided to the bit line BL. Consequently, the hot carriers cannot be injected into the floating gate of the floating gate transistor F.

In case that no hot carriers are stored in the floating gate of the floating gate transistor F, the OTP non-volatile memory cell c1 is in a first storage state (i.e., an off state). Whereas, in case that the hot carriers are stored in the floating gate of the floating gate transistor F, the OTP non-volatile memory cell c1 is in a second storage state (i.e., an on state). In other words, the OTP non-volatile memory cell c1 is in the first storage state after the program inhibition action is performed on the OTP non-volatile memory cell c1, and the OTP non-volatile memory cell c1 is in the second storage state after the program action is performed on the OTP non-volatile memory cell c1.

For performing a read action, proper bias voltages are provided to the OTP non-volatile memory cell c1. Consequently, the OTP non-volatile memory cell c1 generates a cell current. According to the magnitude of the cell current, the storage state of the OTP non-volatile memory cell c1 can be judged.

For example, when the read action is performed, a read voltage is provided to the source line SL, the on voltage is provided to the word line WL, and the ground voltage is provided to the bit line BL. In case that the OTP non-volatile memory cell c1 is in the first storage state (i.e., the off state), the cell current is nearly zero. In case that the OTP non-volatile memory cell c1 is in the second storage state (i.e., the on state), the cell current is higher. The bit line BL of the OTP non-volatile memory cell c1 is connected with a sensing circuit (not shown). According to the magnitude of the cell current, the sensing circuit judges whether the OTP non-volatile memory cell c1 is in the first storage state (i.e., the off state) or the second storage state (i.e., the on state).

Generally, the magnitude of the program voltage is high. In order to prevent from damage of the switching transistor M during the write cycle, the OTP non-volatile memory cell may be further equipped with a following transistor. FIG. 1B is a schematic circuit diagram illustrating another OTP non-volatile memory cell. As shown in FIG. 1B, the OTP non-volatile memory cell c2 comprises a floating gate transistor F, a following transistor Mg and a switching transistor M. The first terminal of the OTP non-volatile memory cell c2 is connected with a source line SL. The second terminal of the OTP non-volatile memory cell c2 is connected with a bit line BL. The first control terminal of the OTP non-volatile memory cell c2 is connected with a word line WL. The second control terminal of the OTP non-volatile memory cell c2 is connected with a following line FL.

Please refer to FIG. 1B again. The first source/drain terminal of the switching transistor M is connected with the source line SL. The gate terminal of the switching transistor M is connected with the word line WL. The first source/drain terminal of the following transistor Mg is connected with the second source/drain terminal of the switching transistor M. The gate terminal of the following transistor Mg is connected with the following line FL. The first source/drain terminal of the floating gate transistor F is connected with the second source/drain terminal of the following line FL.

The second source/drain terminal of the floating gate transistor F is connected with the bit line BL.

Generally, the operation of the switching transistor M and the operation of the following transistor Mg are similar. When the switching transistor M is turned on, the following transistor Mg is turned on. When the switching transistor M is turned off, the following transistor Mg is turned off. The bias voltages and the operating principles of the OTP non-volatile memory cell c2 for performing the write action and the read action are similar to those of the OTP non-volatile memory cell c1, and are not redundantly described herein.

FIG. 1C is a schematic circuit diagram illustrating an MTP non-volatile memory cell. In comparison with the OTP non-volatile memory cell c1 of FIG. 1A, the MTP non-volatile memory cell c3 further comprises an erase capacitor C. The erase capacitor C is connected between the floating gate of the floating gate transistor F and an erase line EL. When the write action and the read action are performed, a ground voltage is provided to the erase line EL, and the other bias voltages provided to the MTP non-volatile memory cell c3 are similar to those of the OTP non-volatile memory cell c1. The detailed operations are redundantly described herein.

For performing an erase action, an erase voltage is provided to the erase line EL. Consequently, the hot carriers are moved from the erase capacitor C to the erase line EL and ejected from the floating gate.

FIG. 1D is a schematic circuit diagram illustrating another MTP non-volatile memory cell. In comparison with the OTP non-volatile memory cell c2 of FIG. 1B, the MTP non-volatile memory cell c4 further comprises an erase capacitor C. The erase capacitor C is connected between the floating gate of the floating gate transistor F and an erase line EL. When the write action and the read action are performed, a ground voltage is provided to the erase line EL, and the other bias voltages provided to the MTP non-volatile memory cell c4 are similar to those of the OTP non-volatile memory cell c2. The detailed operations are not redundantly described herein.

Similarly, for performing an erase action, an erase voltage is provided to the erase line EL. Consequently, the hot carriers are moved from the erase capacitor C to the erase line EL and ejected from the floating gate.

In the non-volatile memory cells as shown in FIGS. 1A to 1D, the transistors are P-type transistors. Alternatively, the transistors of the OTP non-volatile memory cells and the MTP non-volatile memory cells are N-type transistors.

FIG. 1E is a schematic circuit diagram illustrating another MTP non-volatile memory cell. As shown in FIG. 1E, the MTP non-volatile memory cell c5 comprises a switching transistor M and a resistor R. The first terminal of the MTP non-volatile memory cell c5 is connected with a source line SL. The second terminal of the MTP non-volatile memory cell c5 is connected with a bit line BL. The control terminal of the MTP non-volatile memory cell c5 is connected with a word line WL.

The first source/drain terminal of the switching transistor M is connected with the source line SL. The gate terminal of the switching transistor M is connected with the word line WL. The second source/drain terminal of the switching transistor M is connected with the first terminal of the resistor R. The second terminal of the resistor R is connected with the bit line BL. The resistor R is made of transition metal oxide (TMO).

Generally, the storage state of the resistor R can be determined according to the voltage difference between the first terminal and the second terminal of the resistor R. For example, if the voltage difference between the first terminal and the second terminal of the resistor R has a first polarity (e.g., the negative polarity), the resistor R is in a first storage state corresponding to the high resistance. Whereas, if the voltage difference between the first terminal and the second terminal of the resistor R has a second polarity (e.g., the positive polarity), the resistor R is in a first storage state corresponding to the low resistance. In other words, when the write action is performed, proper bias voltages are provided to the MTP non-volatile memory cell c5. Consequently, the storage state of the MTP non-volatile memory cell c5 is controllable.

FIG. 2 is a schematic circuit diagram illustrating a cell array of a non-volatile memory. As shown in FIG. 2, the cell array 200 comprises a plural memory cells c11~cmn, which are arranged in an m×n array. Each of the memory cells c11~cmn has the structure of the OTP non-volatile memory cell c1. It is noted that the structure of the memory cell is not restricted. That is, the memory cells c2~c5 may be constituted as other cell arrays.

The memory cells c11~cmn comprise switching transistors $M_{1,1}$~$M_{m,n}$ and floating gate transistors $F_{1,1}$~$F_{m,n}$, respectively. Each of the memory cells c11~cmn has the structure of the OTP non-volatile memory cell c1. The detailed structure of the memory cell is not redundantly described herein. The first terminals of the memory cells c11~cmn are connected with a source line SL, wherein m and n are positive integers.

The control terminals of the n memory cells c11~c1$n$ in the first row are connected with a word line WL1. The second terminals of the n memory cells c11~c1$n$ in the first row are connected with the corresponding bit lines BL1~BLn, respectively. The control terminals of the n memory cells c21~c2$n$ in the second row are connected with a word line WL2. The second terminals of the n memory cells c21~c2$n$ in the second row are connected with the corresponding bit lines BL1~BLn, respectively. The rest may be deduced by analog.

Generally, during the write action or the read action of the non-volatile memory, only one of the m word lines WL1~WLm of the cell array 200 is activated and the other word lines are inactivated. For example, if the word line WL1 is activated during the write action, the first row is the selected row. Since various bias voltages are provided to the bit lines BL1~BLn, the program action or the program inhibition action is performed on the corresponding memory cells of the selected row. When the program inhibition action is performed on the memory cell, the hot carriers cannot be injected into the floating gate of the floating gate transistor. Consequently, the memory cell is in the first storage state. When the program action is performed on the memory cell, the hot carriers are injected into the floating gate of the floating gate transistor. Consequently, the memory cell is in the second storage state. For example, if a ground voltage is provided to the bit line BL1, the memory cell c11 is in the second storage state. Whereas, if the bit line BL2 is in the floating state, the memory cell c12 is in the first storage state.

The memory cells of the conventional cell array are single-level memory cells. That is, one memory cell is able to store a 1-bit data. The data indicates the first storage state or the second storage state. When the write action is performed, the memory cell is selectively in the first storage state or the second storage state according to the result of injecting the hot carriers into the floating gate or not injecting the hot carriers into the floating gate.

In some situations, the memory cells are multi-level memory cells. That is, one memory cell stores the data with at least two bits. For example, if the multi-level memory cell is able to store a 2-bit data, the data of the memory cell indicates one of a first storage state, a second storage state, a third storage state and a fourth storage state. Similarly, if the multi-level memory cell is able to store a 3-bit data, the multi-level memory cell has eight ($=2^3$) storage states. Similarly, if the multi-level memory cell is able to store a 4-bit data, the multi-level memory cell has sixteen ($=2^4$) storage states.

For allowing the multi-level memory cell to have different storage states, it is necessary to control the amount of hot carriers injected into the floating gate during the write action. However, due to the process variation of the memory cells and the load differences on the bit lines BL1~BLn, some drawbacks occur. For example, even if two memory cells have the same amount of injected hot carriers, the storage states of the two memory cells may be different.

SUMMARY OF THE INVENTION

An embodiment of the present invention provides a non-volatile memory. The non-volatile memory includes a cell array, a current supply circuit, a path selecting circuit, a verification circuit and a control circuit. The cell array includes plural multi-level memory cells in an m×n array. The cell array is connected with m word lines and n bit lines. Each of the plural multi-level memory cells is in one of X storage states, wherein X is larger than or equal to 4. The path selecting circuit is connected with the current supply circuit and the n bit lines. The path selecting circuit comprises n path selectors. The n path selectors are connected with the current supply circuit and the corresponding n bit lines. The verification circuit is connected with the path selecting circuit. The verification circuit includes n verification devices. The n verification devices are connected with the corresponding n path selectors and generate n verification signals. The control circuit receives the n verification signals. During a sample period of a verification action, the control circuit controls the current supply circuit to provide n M-th reference currents to the n verification devices through the n path selectors and convert the n M-th reference currents into n reference voltages. During a verification period of the verification action, the control circuit controls the n multi-level memory cells of a selected row to generate n cell currents to the n verification devices through the n bit lines and the n path selectors and convert the n cell currents into n sensed voltages. The n verification devices generate the n verification signals according to the corresponding reference voltages and the corresponding sensed voltages. According to the n verification signals, the control circuit judges whether the n multi-level memory cells have reached an M-th storage state of the X storage states, wherein m, n, M and X are positive integers, and M is smaller than or equal to X.

Another embodiment of the present invention provides a program control method for the non-volatile memory. The program control method includes the following steps. Firstly, a selected row of the cell array is determined, and a program cycle of the selected row is started. Then, M is set as 1. In a step (a), the current supply circuit provides the n M-th reference currents to the path selecting circuit. In a step (b), the memory cells in the selecting row which have reached the target storage states undergo a program inhibition action. In a step (c), the memory cells of the selected row which have not reached the target storage states undergo a M-th program procedure and are programmed to a M-th storage state. In a step (d), judge whether M is equal to X, when all of the programmed memory cells in step (c) have reached the M-th storage state. if M is not equal to X, add 1 to M and perform the step (a) again; else, end the program cycle.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4A is a schematic circuit diagram illustrating the detailed structures of the current supply circuit of the non-volatile memory as shown in FIG. 3;

FIG. 4B is a schematic timing waveform diagram illustrating associated signals of the current supply circuit;

FIGS. 5A, 5B and 5C are schematic circuit diagrams illustrating the operations of the copy unit in the current supply circuit of FIG. 4A;

FIG. 8A is a flowchart illustrating a program control method for a multi-level memory cell according to an embodiment of the present invention;

FIG. 8B schematically illustrates the target storage states of the memory cells in the selected row;

FIG. 8C schematically illustrates the operation of the program control method;

DETAILED DESCRIPTION OF PREFERRED EMBODIMENTS

The present invention provides a non-volatile memory with a multi-level cell array. The multi-level cell array is a cell array with plural memory cells. The memory cells of the multi-level cell array have the structures of the memory cells as shown in FIGS. 1A to 1E. Since the memory cells of the multi-level cell array are multi-level memory cells, each memory cell has at least four storage states. In different storage states, the magnitudes of the cell currents generated by the memory cells are different.

Figure 1A:
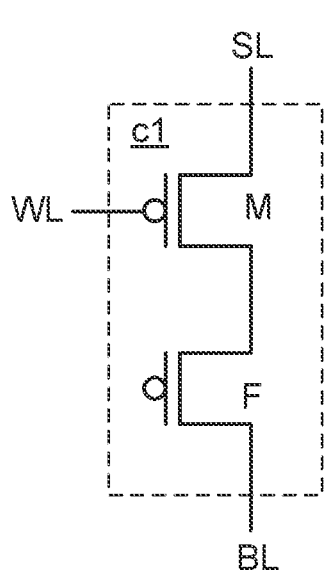
FIGS. 1A-1E (prior art) are schematic circuit diagrams illustrating some types of non-volatile memory cells.
Figure 1B:
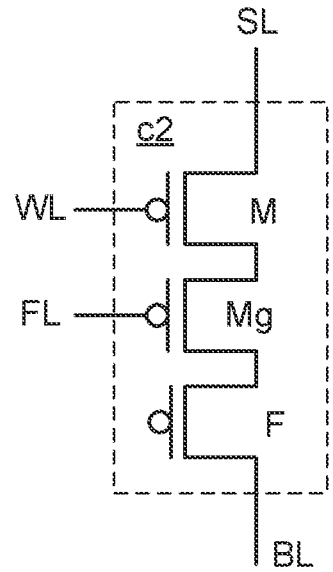
Figure 1C:
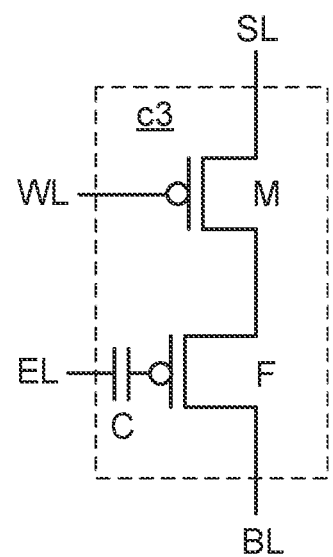
Figure 1D:
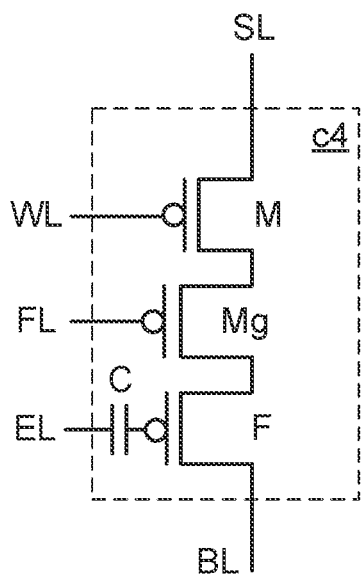
Figure 1E:
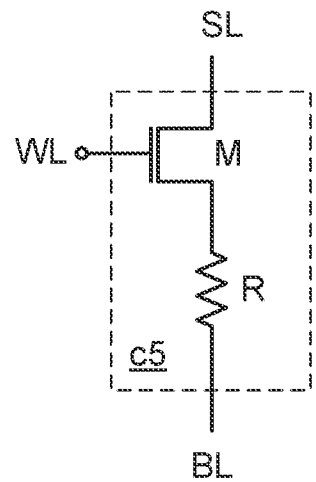

Take the memory cell c1 as shown in FIG. 1A for example. According to the amount of hot carriers injected into the floating gate from low to high, the memory cell c1 has the storage states from a first storage state to an X-th storage state, wherein X is larger than or equal to 4. For example, if the multi-level memory cell c1 is able to store the 2-bit data, X=4. That is, the memory cell c1 is in one of a first storage state, a second storage state, a third storage state and a fourth storage state. Whereas, if the multi-level memory cell c1 is able to store the 3-bit data, X=8. That is, the memory cell c1 is in one of the storage states from the first storage state to the eighth storage state. Whereas, if the multi-level memory cell c1 is able to store the 4-bit data, X=16. That is, the memory cell c1 is in one of the storage states from the first storage state to the sixteenth storage state.

For example, if the multi-level memory cell c1 is able to store the 2-bit data, the magnitudes of the generated cell currents corresponding to the four storage states are different during the read action. For example, the generated cell current corresponding to the first storage state is 0.1 µA, the generated cell current corresponding to the second storage state is 0.6 µA, the generated cell current corresponding to the third storage state is 1.1 µA, and the generated cell current corresponding to the fourth storage state is 1.6 µA.

In an embodiment, plural write actions and plural verification actions are performed during the program cycle. Moreover, the time period of performing each write action is very short (e.g., 100 ns). Consequently, few hot carriers are injected into the floating gate of the memory cell. After the write action is completed, the verification action is immediately performed to judge whether the magnitude of the cell current generated by the memory cell complies with a predetermined storage state. If the magnitude of the cell current generated by the memory cell does not comply with the predetermined storage state, the write action is continuously performed to inject few hot carriers into the floating gate of the memory cell again. The write action and the verification action are continuously performed until the magnitude of the cell current generated by the memory cell complies with the predetermined storage state.

Hereinafter, the multi-level memory cell capable of storing 2-bit data will be taken as an example to describe the concepts of the present invention. It is noted that the technology of the present invention can be applied to the multi-level memory cell capable of storing the data with more than two bits.

Figure 2:
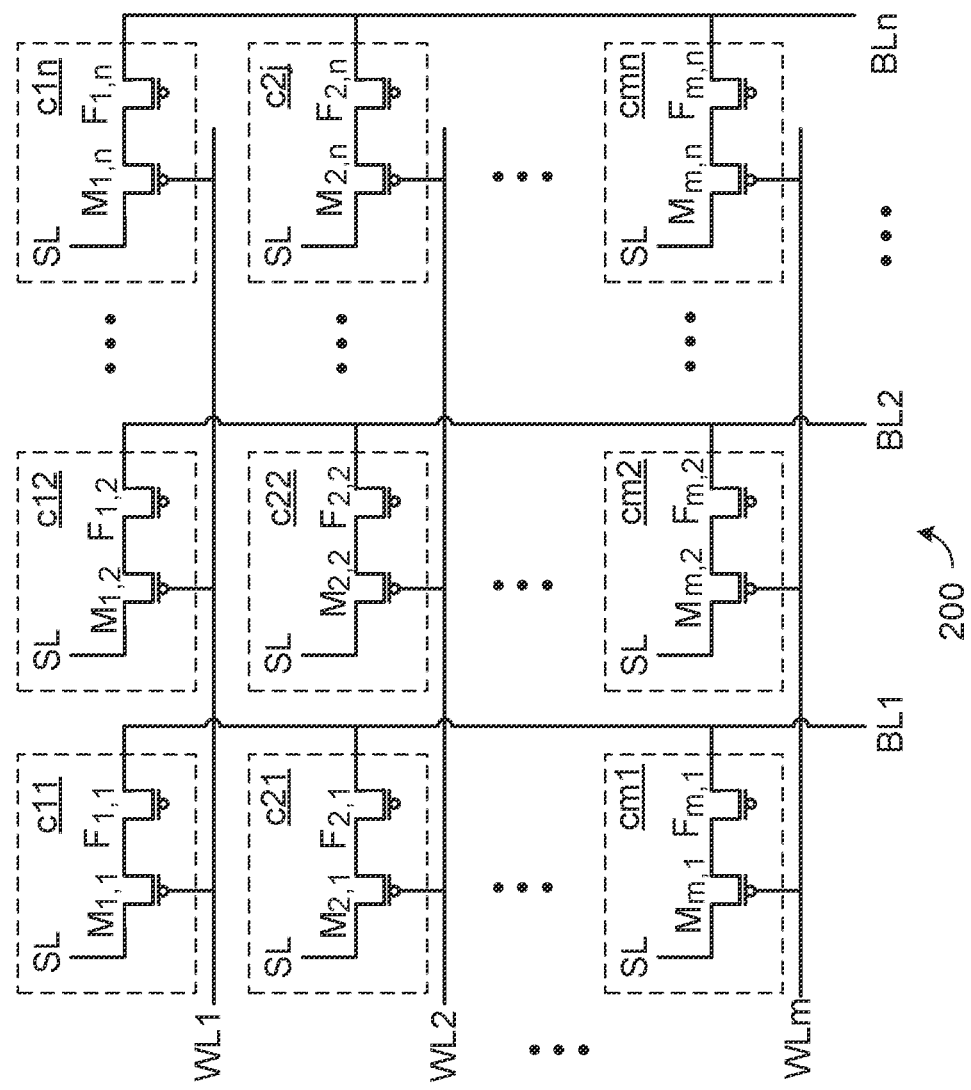
FIG. 2 (prior art) is a schematic circuit diagram illustrating a cell array of a non-volatile memory.
Figure 3:
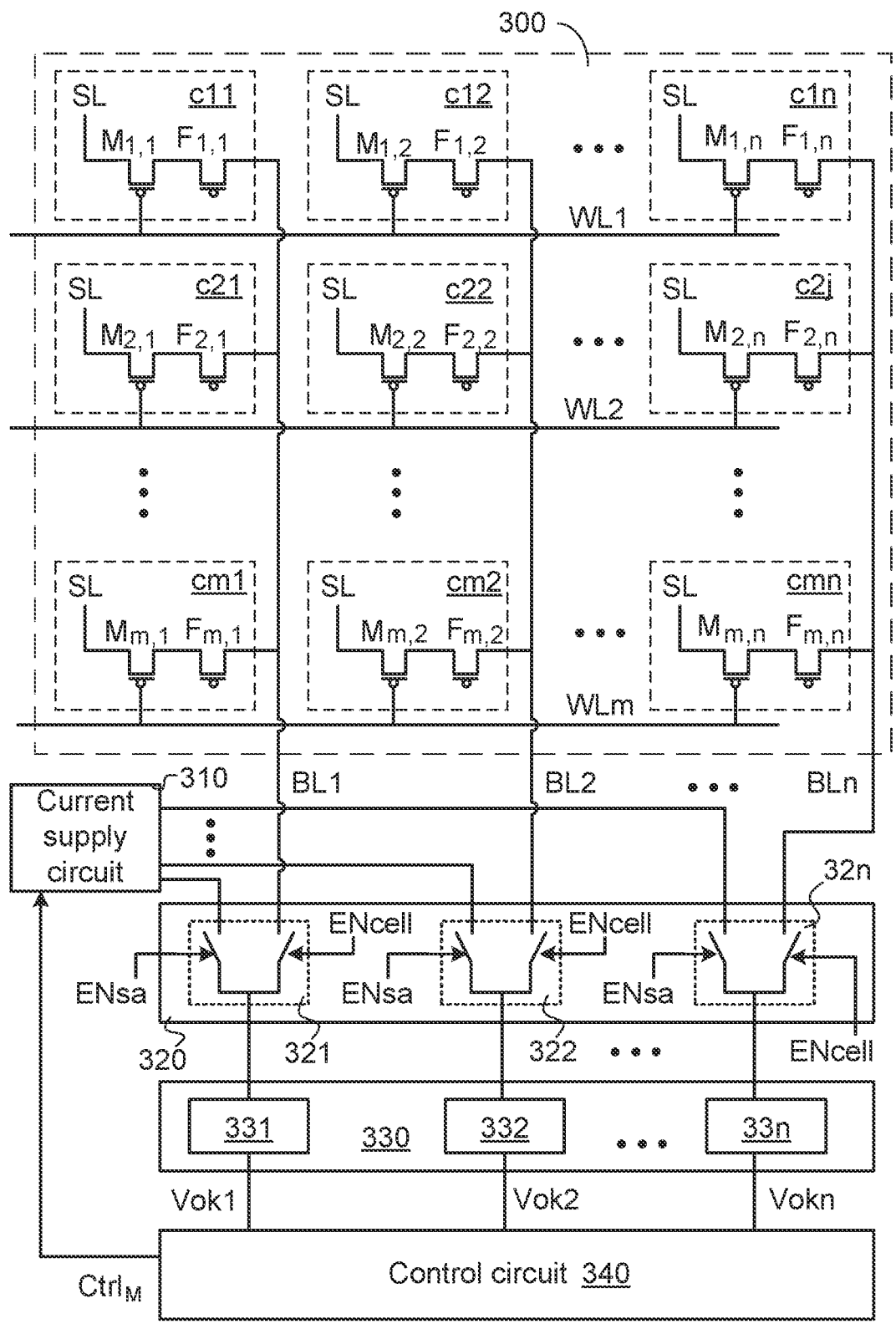
FIG. 3 is a schematic circuit diagram illustrating a non-volatile memory according to the embodiment of the present invention.

FIG. 3 is a schematic circuit diagram illustrating a non-volatile memory according to the embodiment of the present invention. As shown in FIG. 3, the non-volatile memory comprises a cell array 300, a current supply circuit 310, a path selecting circuit 320, a verification circuit 330 and a control circuit 340. The cell array 300 comprises plural memory cells in an m×n array. The circuitry structure of the cell array 300 is similar to the circuitry structure of the cell array as shown in FIG. 2, and not redundantly described herein. The memory cells of the cell array 300 are OTP memory cells or MTP memory cells.

The current supply circuit 310 receives a control signal $Ctrl_M$. The current supply circuit 310 comprises plural current sources to provide one of X reference currents according to the control signal $Ctrl_M$. For example, in case that the multi-level memory cell is able to store the 2-bit data, the generated cell current corresponding to the first storage state is 0.1 µA, the generated cell current corresponding to the second storage state is 0.6 µA, the generated cell current corresponding to the third storage state is 1.1 µA, and the generated cell current corresponding to the fourth storage state is 1.6 µA. Under this circumstance, the current supply circuit 310 provides four reference currents (i.e., X=4) corresponding to the four storage states. That is, the first reference current is 0.1 µA, the second reference current is 0.6 µA, the third reference current is 1.1 µA, and the fourth reference current is 1.6 µA.

Similarly, in case that the multi-level memory cell is able to store the 3-bit data, the current supply circuit 310 provides eight reference currents. Similarly, in case that the multi-level memory cell is able to store the 4-bit data, the current supply circuit 310 provides sixteen reference currents.

The path selecting circuit 320 comprises n path selectors 321~32n. The verification circuit 330 comprises n verification devices 331~33n. The n verification devices 331~33n are connected with the n path selectors 321~32n, respectively. The n verification devices 331~33n generate n verification signals Vok1~Vokn. The structures of the path selectors 321~32n are identical. The structures of the verification devices 331~33n are identical.

In an embodiment, the current supply circuit 310 provides one of the X reference currents to the n path selectors 321~32n. For example, the current supply circuit 310 can provide n first reference currents (e.g., 0.1 µA) to the n path selectors 321~32n. Alternatively, the current supply circuit 310 can provide n second reference currents (e.g., 0.6 µA) to the n path selectors 321~32n. The rest may be deduced by analog.

The operations of the path selector 321 and the verification device 331 will be described as follows. The path selector 321 comprises a reference current path and a cell current path. The reference current path is connected with the current supply circuit 310. The cell current path is connected with the bit line BL1. The reference current path is controlled according to a reference current enable signal ENsa. The cell current path is controlled according to a cell current enable signal ENcell. When the reference current enable signal ENsa is activated, the current supply circuit 310 is connected with the verification device 331 through the reference current path of the path selector 321. When the cell current enable signal ENcell is activated, the bit line BL1 is connected with the verification device 331 through the cell current path of the path selector 321.

When a verification action is performed, the verification device 331 receives the reference current from the current supply circuit 310 and converts the reference current into a reference voltage. Then, the verification device 331 receives the cell current from the bit line BL1 and converts the cell current into a sensed voltage. Then, the verification device 331 generates a verification signal Vok1 according to the reference voltage and the sensed voltage.

The control circuit 340 is connected with the verification circuit 330 to receive the n verification signals Vok1~Vokn. Moreover, the control circuit 340 can issue plural signals, including the control signal $Ctrl_M$, the reference current enable signal ENsa and the cell current enable signal ENcell. While the write action and the verification action are performed, the control circuit 340 can control the operations of the non-volatile memory. According to the verification signal Vok1~Vokn, the control circuit 340 can confirm whether the memory cells of the selected row reach the predetermined storage state.

Please refer to FIGS. 4A and 4B. FIG. 4A is a schematic circuit diagram illustrating the detailed structures of the current supply circuit of the non-volatile memory as shown in FIG. 3. FIG. 4B is a schematic timing waveform diagram illustrating associated signals of the current supply circuit. The current supply circuit 310 comprises a current copy circuit 410 and a current generator 420. The current copy circuit 410 receives one of the X reference currents and copies the received reference current into n identical reference current to the n path selectors 321~32n of the path selecting circuit 320.

The current copy circuit 410 comprises n copy units 411~41n. The current output terminals oi1~oin of the n copy units 411~41n are connected with the corresponding path selectors 321~32n. The structures of the n copy units 411~41n are identical. For succinctness, only the circuitry structure of the copy unit 411 will be described as follows.

The copy unit 411 comprises transistors m11~m14, switches w11~w12 and a capacitor c1. The first source/drain terminal of the transistor m11 receives the supply voltage Vdd. The first source/drain terminal of the transistor m13 receives the supply voltage Vdd. The gate terminal of the transistor m13 is connected with the gate terminal of the transistor m11. The first source/drain terminal of the transistor m12 is connected with the second source/drain terminal of the transistor m11. The first source/drain terminal of the transistor m14 is connected with the second source/drain terminal of the transistor m13. The gate terminal of the transistor m14 is connected with the gate terminal of the transistor m12. Moreover, the second source/drain terminal of the transistor m14 is the current output terminal oi1. The first terminal of the capacitor c1 is connected with the gate terminal of the transistor m11. The first terminal of the switch w11 is connected with the second source/drain terminal of the transistor m12. The second terminal of the switch w11 is connected with the second terminal of the capacitor c1. The first terminal of the switch w12 is connected with the second source/drain terminal of the transistor m12. The second terminal of switch w12 is connected to a node c.

The current generator 420 is connected between the node c and a ground terminal GND. The current generator 420 comprises X current sources Iref1~Irefx and a switch set 422. The switch set 422 comprises X switches w1~wx. The switch w1 and the current source Iref1 are serially connected between the node c and the ground terminal GND. The switch w2 and the current source Iref2 are serially connected between the node c and the ground terminal GND. The rest may be deduced by analog. The switch wx and the current source Irefx are serially connected between the node c and the ground terminal GND. The switch set 422 is controlled according to the control signal $Ctrl_M$. Consequently, one of the X switches w1~wx is in a close state, and the other switches are in an open state.

In an embodiment, n activated periods T1~Tn of the copy units are activated sequentially. As shown in FIG. 4B, the interval between the time point ta and the time point tb is a first activated period T1. After n activated periods T1~Tn, the capacitors c1~cn of the copy units 411~41n store driving voltages. In other words, after n activated periods T1~Tn are activated sequentially, the corresponding driving voltages have been stored in the capacitors c1~cn of the copy units 411~41n. In addition, n reference currents with the same magnitude are outputted from the current output terminals oi1~oin of the copy units 411~41n.

FIGS. 5A, 5B and 5C are schematic circuit diagrams illustrating the operations of the copy unit in the current supply circuit of FIG. 4A. The operations of the copy units 411~41n are similar. For succinctness, only the operations of the copy unit 411 will be described as follows.

Please refer to FIG. 4B and FIG. 5A. Before the time point ta, the control signal $Ctrl_M$ is 1 and the switches w11 and w12 receive a turn-off level (i.e. a low level). Consequently, the switches w11 and w12 are in the open state. In the current generator 420, the current source Iref1 is connected between the node c and the ground terminal GND.

Please refer to FIG. 4B and FIG. 5B. In the interval between the time point to and the time point tb, the control signal $Ctrl_M$ is 1. During the first activated period T1, the switches w11 and w12 receive a turn-on level (i.e. a high level). Consequently, the switches w11 and w12 are in the close state. The first reference current Iref1 generated by the current source Iref1 flows through the transistors m11 and m12. In addition, a driving voltage Vd1 is stored in the capacitor c1.

Please refer to FIG. 4B and FIG. 5C. After the time point tb, the control signal $Ctrl_M$ is 1 and the first activated period T1 is ended. Meanwhile, the switch w11 receives the turn-on level, and the switch w12 receives the turn-off level. Consequently, the switch w11 is in the close state, and the switch w12 is in the open state. The first reference current Iref1 does not flow through the transistors m11 and m12. In addition, the driving voltage Vd1 is stored in the capacitor c1.

Similarly, the other copy units 412~41n are operated according to the activated periods T2~Tn. After the activated periods T2~Tn, the corresponding driving voltages are stored in the capacitors c2~cn of the corresponding copy units 412~41n.

During the verification action of the non-volatile memory, the first reference currents Iref1 are outputted from the current output terminals oi1~oin of the copy units 411~41n to the path selectors 321~32n of the path selecting circuit 320 according to the driving signals of the corresponding capacitors.

Moreover, the control signal $Ctrl_M$ is any value from 1 to X. According to the control signal $Ctrl_M$, the current copy circuit 410 generates the corresponding reference current of the reference currents Iref1~Irefx. For example, if the control signal $Ctrl_M$ is 2, the current source Iref2 is connected between the node c and the ground terminal GND by the current generator 410. During the verification action of the non-volatile memory, the second reference currents Iref2 are outputted from the current output terminals oi1~oin of the copy units 411~41n to the path selectors 321~32n of the path selecting circuit 320.

Moreover, since the activated periods T1~Tn are activated sequentially, it takes a long time for the copy units 411~41n of the current copy circuit 410 to prepare the driving voltages. For reducing the time period of preparing the driving voltages, the current supply circuit 310 could be further modified.

For example, in another embodiment, the current supply circuit 310 comprises two current copy circuits with the same circuitry structure. The two current copy circuits are controlled by the control circuit. When the n copy units of the first current copy circuit output the n first reference currents Iref1, the n copy units of the second current copy circuit prepare the driving voltages corresponding to the second reference current Iref2. Similarly, when the n copy units of the second current copy circuit output the n second reference currents Iref2, the n copy units of the first current copy circuit prepare the driving voltages corresponding to the third reference current Iref3. The rest may be deduced by analog.

Figure 6A:
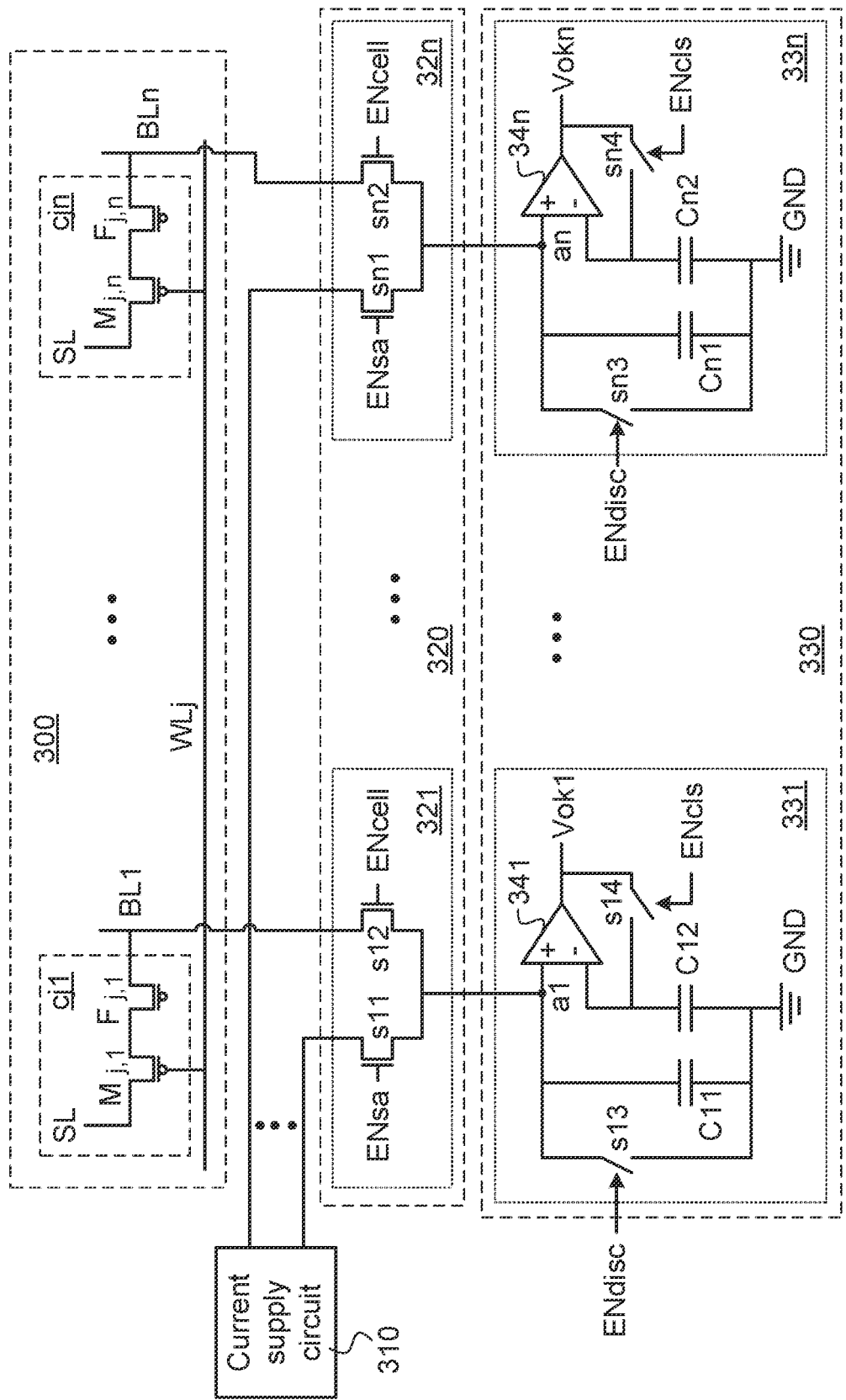
FIG. 6A is a schematic circuit diagram illustrating the detailed structures of the path selecting circuit and the verification circuit of the non-volatile memory as shown in FIG. 3.
Figure 6B:
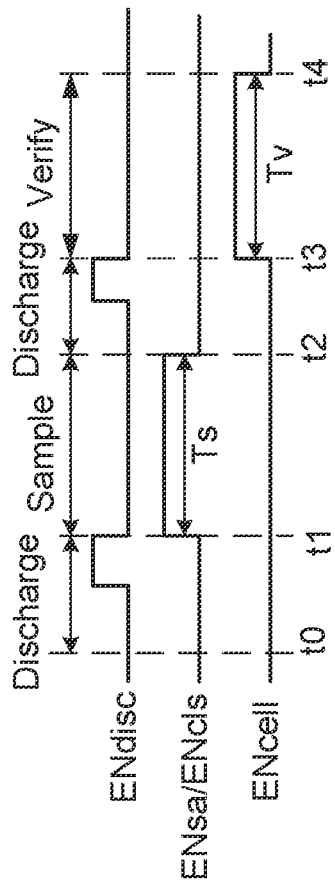
FIG. 6B is a schematic timing waveform diagram illustrating associated signals of the path selecting circuit and the verification circuit.

Please refer to FIGS. 6A and 6B. FIG. 6A is a schematic circuit diagram illustrating the detailed structures of the path selecting circuit and the verification circuit of the non-volatile memory as shown in FIG. 3. FIG. 6B is a schematic timing waveform diagram illustrating associated signals of the path selecting circuit and the verification circuit. For succinctness, only n memory cells cj1~cjn in the j-th row of the cell array 300 are shown in FIG. 6A. These memory cells are connected with the word line WLj.

The path selecting circuit 320 comprises n path selectors 321~32n. The verification circuit 330 comprises n verification devices 331~33n. The structures of the path selectors 321~32n are identical. The structures of the verification devices 331~33n are identical. The operations of the path selector 321 and the verification device 331 will be described as follows.

The reference current path of the path selector 321 comprises a switching transistor s11. The first source/drain terminal of the switching transistor s11 is connected with the current supply circuit 310. The second source/drain terminal of the switching transistor s11 is connected with the node a1. The gate terminal of the switching transistor s11 receives the reference current enable signal ENsa. The cell current path of the path selector 321 comprises a switching transistor s12. The first source/drain terminal of the switching transistor s12 is connected with the bit line BL1. The second source/drain terminal of the switching transistor s12 is connected with the node a1. The gate terminal of the switching transistor s12 receives the current enable signal ENcell.

The verification device 331 comprises an operation amplifier 341, a switch s13, a switch s14, a capacitor C11 and a capacitor C12. The first terminal of the switch s13 is connected with the node a1. The second terminal of the switch s13 is connected with a ground terminal GND. The control terminal of the switch s13 receives a discharge enable signal ENdisc. The first terminal of the capacitor C11 is connected with the node a1. The second terminal of the capacitor C11 is connected with the ground terminal GND. The first terminal of the capacitor C12 is connected with a negative input terminal of the operation amplifier 341. The second terminal of the capacitor C12 is connected with the ground terminal GND. A positive input terminal of the operation amplifier 341 is connected with the node a1. An output terminal of the operation amplifier 341 generates the verification signal Vok1. The first terminal of the switch s14 is connected with the output terminal of the operation amplifier 341. The second terminal of the switch s14 is connected with the negative input terminal of the operation amplifier 341. The control terminal of the switch s14 receives a close-loop enable signal ENcls. For example, the switches s13 and s14 are transistors. In addition, the discharge enable signal ENdisc and the close-loop enable signal Encls are outputted from the control circuit 340.

Please refer to FIG. 6A. When the word line WLj is activated, the write action is performed on the memory cells cj1~cjn of the selected row. After the write action is completed, the verification action is performed. Consequently, the control circuit 340 judges whether the memory cells cj1~cjn of the selected row are in the predetermined storage states according to the verification signals Vok1~Vokn.

As shown in FIG. 6B, the verification action contains a reference current sampling phase and a cell current sampling phase. In the reference current sampling phase, the reference current enable signal ENsa and the close-loop enable signal ENcls are activated.

Please refer to FIG. 6B. The time interval between the time point t0 and the time point t2 is the reference current sampling phase. The time interval between the time point t2 and the time point t4 is the cell current sampling phase. The reference current sampling phase contains a discharge period and a sample period. The cell current sampling phase contains a discharge period and a verification period. The time interval between the time point t0 and the time point t1 is the discharge period (Discharge) of the reference current sampling phase. The time interval between the time point t1 and the time point t2 is the sample period (Sample) of the reference current sampling phase. The time interval between the time point t2 and the time point t3 is the discharge period (Discharge) of the cell current sampling phase. The time interval between the time point t3 and the time point t4 is the verification period (Verify) of the cell current sampling phase.

In an embodiment, the time duration Ts of the sample period (Sample) in the reference current sampling phase and the time duration Tv of the verification period (Verify) in the cell current sampling phase may be adjusted according to the practical requirements. The relationship between the reference current and the cell current can be judged according to the time duration Ts of the sample period (Sample) and the time duration Tv of the verification period (Verify). Generally, the time duration Tv of the verification period (Verify) is larger than or equal to the time duration Ts of the sample period (Sample).

FIGS. 7A~7D are schematic circuit diagrams illustrating the operations of the path selector 321 and the verification device 331 during the verification action. For illustration, it is assumed that the time duration Tv of the verification period (Verify) is equal to the time duration Ts of the sample period (Sample).

Figure 7A:
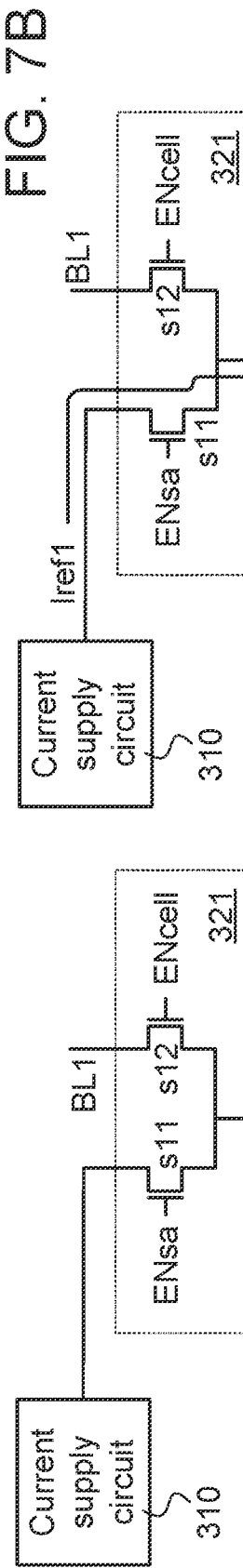
FIGS. 7A-7D are schematic circuit diagrams illustrating the operations of a path selector of the path selecting circuit and a verification device of the verification circuit as shown in FIG. 6A during the verification action.

Please refer to FIGS. 6B and 7A. In the discharge period (Discharge) between the time point t0 and the time point t1, only the discharge enable signal ENdisc is enabled. Consequently, the switch s13 of the verification device 331 is in a close state, and the voltage of the capacitor C11 is discharged to the ground voltage (0V).

Figure 7B:
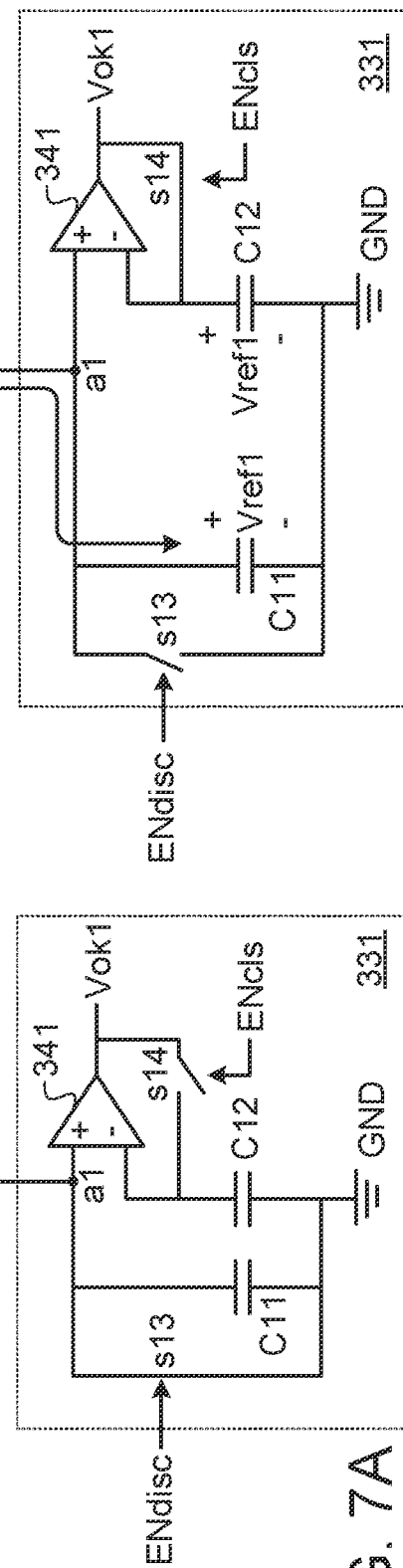

Please refer to FIGS. 6B and 7B. In the sample period (Sample) between the time point t1 and the time point t2, the reference current enable signal ENsa and the close-loop enable signal ENcls are activated. Consequently, the reference current path of the path selector 321 is connected between the current supply circuit 310 and the verification device 331, and the switch s14 of the verification device 331 is in the close state. Under this circumstance, the operation amplifier 341 becomes a unit gain buffer. The current supply circuit 310 provides a reference current Iref1 to charge the capacitor C11. In addition, the unit gain buffer duplicates the voltage of the capacitor C11 to the capacitor C12. In other words, at the time point t2, the voltage of the capacitor C11 is charged to the first reference voltage Vref1 and the voltage of the capacitor C11 is charged to the first reference voltage Vref1. Similarly, at the time point t2, the two capacitors in each of the verification devices 332~33n of the verification circuit 330 are also charged to the corresponding reference voltage. For example, the two capacitors Cn1 and Cn2 in the verification device 33n are charged to the n-th reference voltage.

In other words, at the time point t2 after the reference current sampling phase, all of the capacitors C12~Cn2 in the verification devices 331~33n store the corresponding reference voltages.

Figure 7C:
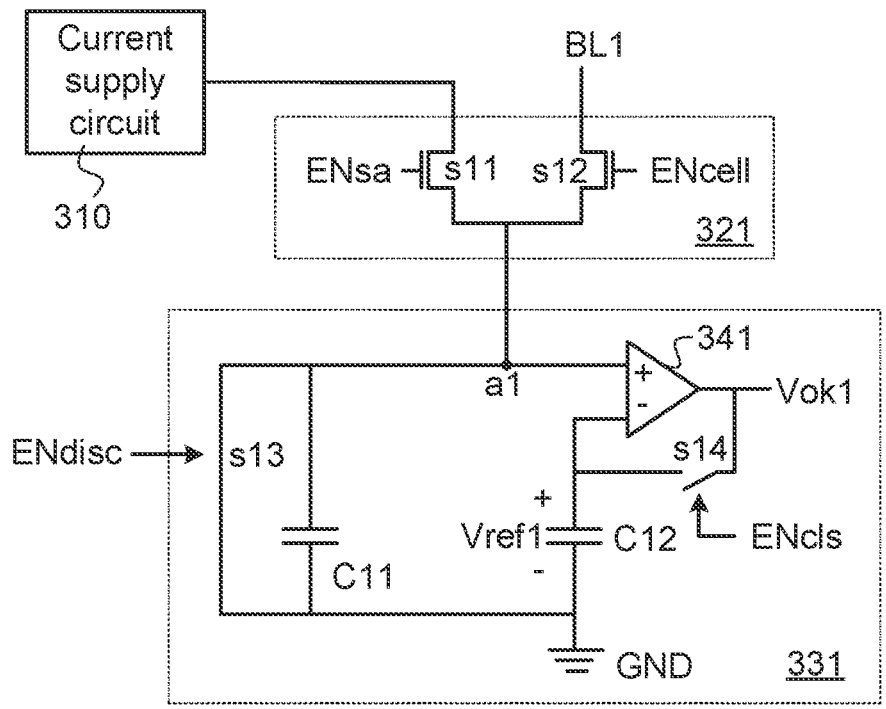

Please refer to FIGS. 6B and 7C. The time interval between the time point t2 and the time point t3 is the discharge period (Discharge) of the cell current sampling phase. In the discharge period, the discharge enable signal ENdisc is activated. Consequently, the switch s13 of the verification device 331 is in the close state according to the discharge enable signal ENdisc. The voltage of the capacitor C11 is discharged to the ground voltage (0V). Meanwhile, the first reference voltage Vref1 is stored in the capacitor C12 only. Similarly, in each of the verification devices 332~33n of the verification circuit 330, only one capacitor stores the corresponding reference voltage.

Please refer to FIG. 6B again. The time interval between the time point t3 and the time point t4 is the verification period (Verify) of the cell current sampling phase. In the time interval, the cell current enable signal ENcell is activated. Consequently, the bit lines BL1~BLn are connected with the corresponding verification devices 331~33n through the corresponding cell current paths of the path selectors 321~32n. Meanwhile, the memory cells cj1~cjn of the selected memory row generate cell currents to the verification devices 331~33n.

Figure 7D:
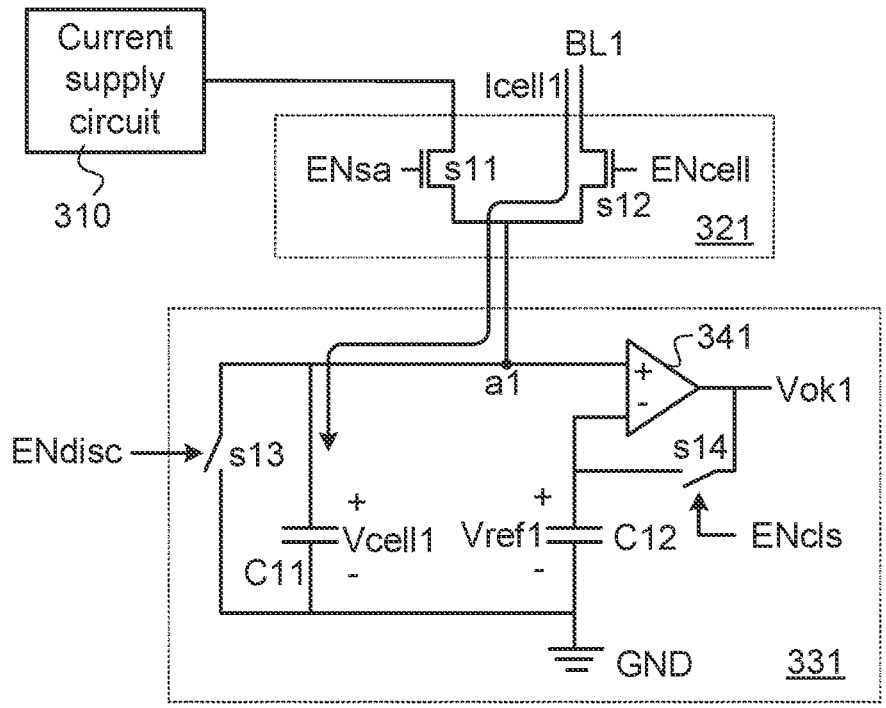

For example, as shown in FIG. 7D, the cell current path of the path selector 321 is connected between the bit line BL1 and the verification device 331. Consequently, the memory cell cj1 of the selected row generates a cell current Icell1 to the verification device 331 to charge the capacitor C11.

At the end of the cell current sampling phase (i.e., the time point t4), the operation amplifier 341 may be considered as a comparator for comparing the first sensed voltage Vcell1 of the capacitor C11 and the first reference voltage Vref1 of the capacitor C12. If the first sensed voltage Vcell1 is lower than the first reference voltage Vref1, the verification signal Vok1 is in a low level state, indicating that the cell current Icell1 is lower than the reference current Iref1. Under this circumstance, the magnitude of the cell current generated by the memory cell cj1 does not comply with the predetermined storage state. Whereas, if the first sensed voltage Vcell1 is higher than the first reference voltage Vref1, the verification signal Vok1 is in a high level state, indicating that the cell current Icell1 is higher than the reference current Iref1. Under this circumstance, the magnitude of the cell current generated by the memory cell cj1 complies with the predetermined storage state.

Similarly, the verification signals Vok2~Vokn from the verification devices 332~33n indicate whether the magnitudes of the cell currents generated by the corresponding memory cells cj2~cjn comply with the predetermined storage states.

For example, if the predetermined storage state is the first storage state, the reference current provided by the current supply circuit 310 is 0.1 µA. Consequently, after the verification action is completed, the verification signals Vok1~Vokn can be used to judge whether the corresponding memory cells of the selected row generate the cell current of 0.1 µA.

For example, if the verification signal Vok1 from the verification device 331 is in the low level state, it means that the cell current generated by the memory cell cj1 is lower than 0.1 µA. Meanwhile, the storage state of the memory cell has not reached the first storage state. Whereas, if the verification signal Vok1 from the verification device 331 is in the high level state, it means that the cell current generated by the memory cell cj1 is higher than 0.1 µA. Meanwhile, the storage state of the memory cell has reached the first storage state.

Similarly, if the predetermined storage state is the second storage state, the reference current provided by the current supply circuit 310 is 0.6 µA. Similarly, if the predetermined storage state is the third storage state, the reference current provided by the current supply circuit 310 is 1.1 µA. Similarly, if the predetermined storage state is the fourth storage state, the reference current provided by the current supply circuit 310 is 1.6 µA. After the verification action is completed, the verification signals Vok1~Vokn can be used to judge whether the corresponding memory cells have reached the predetermined storage states.

In accordance with another feature of the present invention, the control circuit 430 judges the proportional relationship between the reference current Iref and the cell current Icell by adjusting the time duration Ts of the sample period (Sample) and the time duration Tv of the verification period (Verify).

For example, in case that the ratio of Ts to Tv is 3:4, Ts=(3/4)Tv. When the cell current sampling phase is ended, the relationship between the reference current Iref1 and the cell current Icell1 can be judged according to the verification signal Vok1 from the operation amplifier 341. For example, the verification signal Vok1 in the high level state indicates that the cell current Icell1 reaches 3/4 time the reference current Iref1, i.e., Icell1=(3/4)Iref1. Whereas, the verification signal Vok1 in the lower level state indicates that the cell current Icell1 is lower than 3/4 time the reference current Iref1.

Similarly, the verification devices 332~33n of the verification circuit 330 can output the verification signals Vok2~Vokn to indicate the relationship between the corresponding cell current Icell and the reference current Iref1.

It is noted that the relationship between the time duration Ts of the sample period (Sample) and the time duration Tv of the verification period (Verify) may be varied according to the practical requirements. For example, the ratio of Ts to Tv is b:a, wherein a is larger than or equal to b. In other word, the control circuit can judge whether the cell current Icell1 reaches (b/a)×Iref1 according to the verification signal Vok1.

From the above descriptions, the storage state of the multi-level memory cell reaches the predetermined storage state after the multi-level memory cell has been programmed many times. Moreover, due to the characteristic differences of the n memory cells in the selected row, the memory cells in the selected row cannot reach the predetermined storage states simultaneously. For solving this problem, the present invention provides a program control method for the multi-level memory cell.

Please refer to FIGS. 8A, 8B and 8C. FIG. 8A is a flowchart illustrating a program control method for a multi-level memory cell according to an embodiment of the present invention. FIG. 8B schematically illustrates the target storage states of the memory cells in the selected row. FIG. 8C schematically illustrates the operation of the program control method. The program control method is controlled by the control circuit 310. During a program cycle, a selected row of the cell array 300 is determined and subjected to a program action. In the program cycle, X program procedures are performed. Consequently, the n memory cells of the selected row are successively programmed to the target storage states. In addition, the corresponding program procedure is determined according to the control signal $Ctrl_M$ from the control circuit 340.

Please refer to FIG. 8A. After the program cycle is started, M is set as 1 (Step S604) and the current supply circuit 310 provides an M-th reference current (Step S606).

The memory cells in the selected row which have reached the target storage states undergo a program inhibition action (Step S608). Also, the memory cells in the selected row which have not reached the target storage states undergo an M-th program procedure (Step S610).

After the M-th program procedure, all of the programmed memory cells are programmed to the M-th storage state. It means that the memory cells in the selected row have reached the M-th storage state or the target storage states. Then, a step S614 is performed to judge whether M is equal to X. If M is not equal to X, M is added by 1 (Step S616) and the step S606 is repeatedly done. In addition, a next program procedure is performed. Whereas, if M is equal to X, it means that all of the memory cells in the selected row have reached the target storage states. Then, the program cycle is ended. In the above embodiment, M and X are positive integers, and M is smaller than or equal to X.

The operations of the program control method will be illustrated with reference to FIGS. 8B and 8C. For example, each of the multi-level memory cells is able to store the 2-bit data. That is, X=4.

As shown in FIG. 8B, the selected row of the cell array comprises six memory cells ci1~ci6. The target storage states of the six memory cells ci1~ci6 are the fourth storage state (4th), the second storage state (2nd), the first storage state (1st), the third storage state (3rd), the second storage state (2nd) and the third storage state (3rd), respectively. That is, during the program cycle, the six memory cells of the selected row need to be programmed to the target storage states.

Please refer to FIG. 8C. After the program cycle is started, M is equal to 1. That is, the first program procedure is performed. The current supply circuit 310 provides the first reference current. After the write actions and the verification actions are performed on the memory cells ci1~ci6 of the selected row many times, all of the memory cells ci1~ci6 have reached the first storage state. Since the memory cell cj3 has reached the target storage state, the memory cell cj3 will undergo the program inhibition action in the successive steps.

Due to characteristic differences between the memory cells ci1~ci6, all of the memory cells ci1~ci6 may not reach the first storage state simultaneously. The memory cell having reached the first storage state will undergo the program inhibition action during the next write action. That is, only the memory cells having not reached the first storage state will undergo the program action.

Then, M is equal to 2. That is, the second program procedure is performed. The current supply circuit 310 provides the second reference current. After the write actions and the verification actions are performed on the memory cells ci1~ci2 and the memory cells ci4~ci6 of the selected row many times, all of these memory cells have reached the second storage state. Since the memory cells cj2 and ci5 has reached the target storage state, the memory cells cj2 and ci5 will undergo the program inhibition action in the successive steps.

Then, M is equal to 3. That is, the third program procedure is performed. The current supply circuit 310 provides the third reference current. After the write actions and the verification actions are performed on the memory cells ci1, ci4 and ci6 of the selected row many times, all of these memory cells have reached the third storage state. Since the memory cells cj4 and ci6 has reached the target storage state, the memory cells cj4 and ci6 will undergo the program inhibition action in the successive steps.

Then, M is equal to 4. That is, the fourth program procedure is performed. The current supply circuit 310 provides the fourth reference current. After the write actions and the verification actions are performed on the memory cell ci1 of the selected row many times, the memory cell ci1 has reached the fourth storage state. Since the memory cells cj4 and ci1 has reached the target storage state, the program cycle of the selected row is ended.

After the four program procedures are completed, the new program cycle of the next selected row of the cell array is started.

As mentioned above, during the program cycle of the multi-level memory cell for storing the 2-bit data, four (i.e., X=4) program procedures are required to confirm whether all memory cells of the selected row have been programmed to the target storage states. Similarly, during the program cycle of the multi-level memory cell for storing the 3-bit data, eight (i.e., X=8) program procedures are required to confirm whether all memory cells of the selected row have been programmed to the target storage states. Similarly, during the program cycle of the multi-level memory cell for storing the 4-bit data, sixteen (i.e., X=16) program procedures are required to confirm whether all memory cells of the selected row have been programmed to the target storage states.

As mentioned above, each program cycle contains X program procedures. That is, the write actions and the verification actions are performed many times in each program procedure. In other words, the program cycle is very long. For example, after one write action is completed, one verification action is performed to judge whether the memory cells have reached the M-th storage state. However, in the practical condition, it is necessary to perform the write actions and the verification actions more than 100 times in each program procedure in order to confirm that the memory cells have reached the M-th storage state.

Figures 9A, 9B:
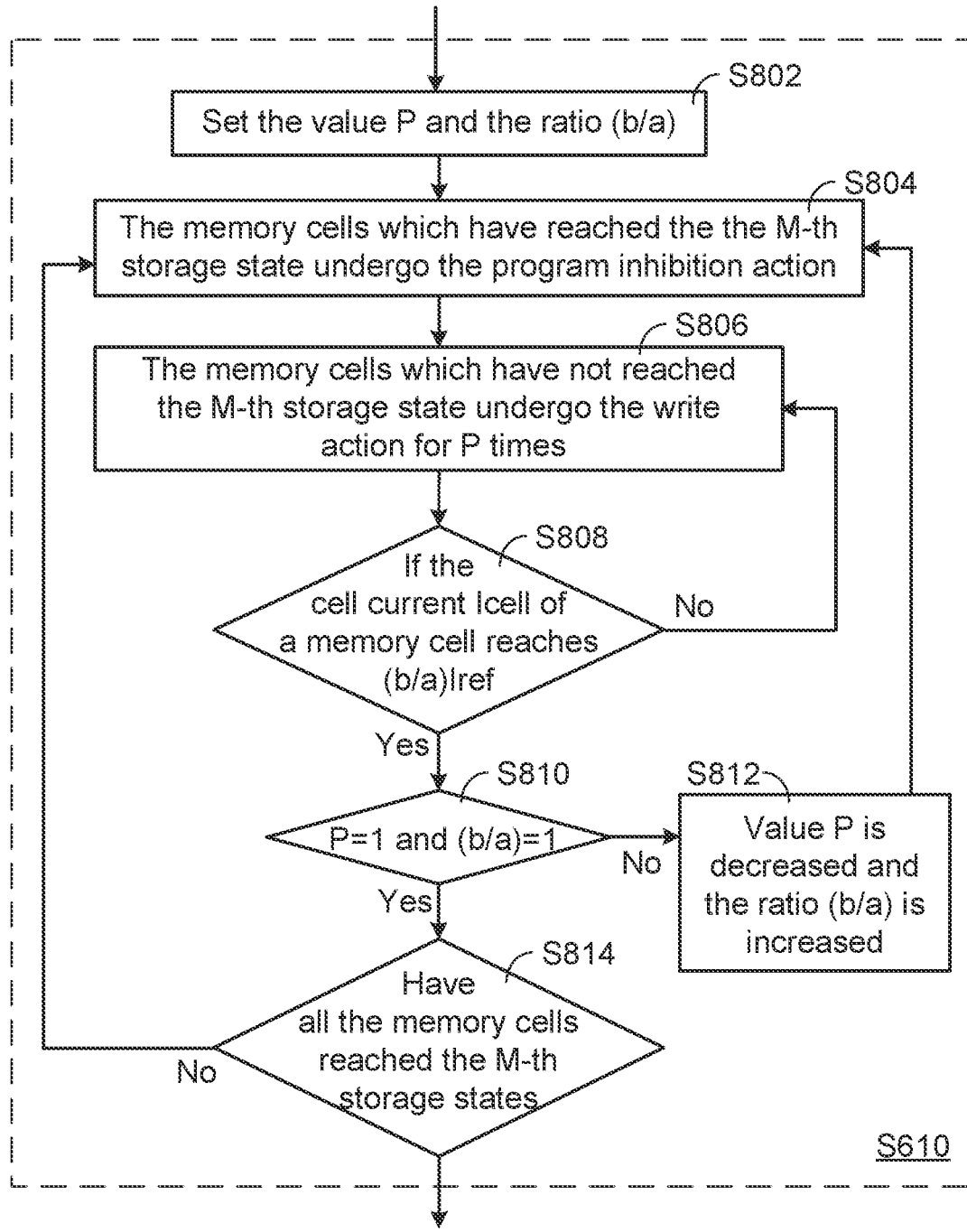
FIG. 9A is a flowchart illustrating a method of shortening the program procedure in the program control method according to the embodiment of the present invention.
FIG. 9B is a lookup-up table about the relationship between the number of write actions (P) and the ratio (b/a) in the program control method according to the embodiment of the present invention.

For reducing the time period of the program cycle, the present invention further provides a method of shortening the M-th program procedure in the step S610. FIG. 9A is a flowchart illustrating a method of shortening the program procedure in the program control method according to the embodiment of the present invention. FIG. 9B is a lookup-up table about the relationship between the number of write actions (P) and the ratio (b/a) in the program control method according to the embodiment of the present invention.

Please refer to FIG. 9A. When the M-th program procedure of the step S610 is started, the number of write actions (P) and the ratio (b/a) are set (Step S802), wherein P is a positive integer and the ratio (b/a) is larger than 0 and smaller than or equal to 1.

Then, the memory cells having reached the M-th storage stage undergo the program inhibition action (Step S804). Then, the memory cells having not reached the M-th storage state undergo the write actions for P times (Step S806). In other words, portions of the n memory cells in the selected row that have reached the M-th storage states will undergo the program inhibition action, and the other portions of the memory cells having not reached the M-th storage state will undergo the write actions for P times.

Then, a verification action is performed to verify whether the cell current Icell of a memory cell reaches (b/a)×Iref (Step S808). During the verification action, the time duration Ts of the sample period (Sample) and the time duration Tv of the verification period (Verify) is adjusted to be equal to (b/a) in order to judge whether Icell=(b/a)× Iref. When the cell current Icell of a memory cell in the selected row does not reach (b/a)× Iref (i.e., (cell<(b/a)× Iref), it means that the storage state of the memory cell in the selected row is not close to the M-th storage state. Then, the step S806 is repeatedly done.

When the cell current Icell of a memory cell in the selected row reaches (b/a)× Iref (i.e., Icell≥(b/a)× Iref), it means that the storage state of the memory cell in the selected row is close to the M-th storage state. Meanwhile, it is necessary to decrease the number of the write actions. Consequently, the memory cell will not be over-programmed.

Then, a step S810 is performed to judge whether P is equal to 1 and the ratio (b/a) is equal to 1. If the judging condition of the step S810 is not satisfied, the value P is decreased and the ratio (b/a) is increased (Step 812), and the step S804 is repeatedly done. Whereas, if the judging condition of the step S810 is satisfied, it means that the memory cell has reached the M-th storage state.

Then, a step S814 is performed to judge whether all of the programmed memory cells have reached the M-storage states. If the judging condition of the step S814 is not satisfied, the step S804 is repeatedly done. Whereas, if the judging condition of the step S814 is satisfied, the program procedure is ended.

The relationship between the value P and the ration (b/a) are listed in the look-up table as shown in FIG. 9B according to the settings. An example of performing the program procedure of FIG. 9A using the look-up table of FIG. 9A will be described as follows.

After the program procedure is started, the value P is set as 5 and the ratio (b/a) is set as (2/3). Then, the memory cells having not reached the M-th storage state undergo the write actions for 5 times. After the 5 write actions are completed, the verification action is performed to judge whether the cell current Icell of any memory cell reaches (2/3)× Iref.

If the cell currents Icell of all memory cells have not reached (2/3)×Iref, it means that all memory cells need to undergo plural write actions to reach the M-th storage state. Consequently, after all memory cells are continuously subjected to 5 write actions, the verification action is performed again. Whereas, if the cell current Icell of any memory cell reaches (2/3)× Iref, it means that the storage state of the memory cell in the selected row is close to the M-th storage state. Meanwhile, it is necessary to decrease the number of the write actions and increase the ratio (b/a).

According to the look-up table, the value P is set as 2 and the ratio (b/a) is set as (4/5). Then, the memory cells having not reached the M-th storge state undergo the write actions for 2 times. After the 2 write actions are completed, the verification action is performed to judge whether the cell current Icell of any memory cell reaches (4/5)×Iref.

Similarly, if result of the verification action indicates that the cell currents Icell of all memory cells have not reached (4/5)×Iref, it means that all memory cells need to undergo plural write actions to reach the M-th storage state. Consequently, after all memory cells are continuously subjected to 2 write actions, the verification action is performed again. Whereas, if the cell current Icell of any memory cell reaches (4/5)× Iref, it means that the storage state of the memory cell in the selected row is close to the M-th storage state. Meanwhile, it is necessary to decrease the number of the write actions and increase the ratio (b/a).

According to the look-up table, the value P is set as 1 and the ratio (b/a) is set as 1. Then, the memory cells having not reached the M-th storge state undergo the write actions for one time. After the write action is completed, the verification action is performed to judge whether the cell current Icell of any memory cell reaches Iref.

If the cell current Icell of any memory cell reaches Iref, it means that the storage state of the memory cell in the selected row has been programmed to the M-th storage state. Meanwhile, it is necessary to perform a single write action and a verification action until all memory cells are programmed to the M-th storage state.

That is, in the program procedure, the control circuit judges whether the storage state of the memory cell is close to the M-th storage state according to the relationship between the cell current and the reference current and correspondingly changes the number of write actions. In the above implementation example, the value P and the ratio (b/a) have been changed three times. It is noted that the number of times of changing the value P and the ratio (b/a) is not restricted. That is, the number of times of changing the value P and the ratio (b/a) may be adjusted according to the practical requirements.

That is, in the earlier stage of the program procedure, a first number and a first ratio are set. The first number is an integer larger than 1, and the first ratio is smaller than 1. After the write actions are performed for plural times corresponding to the first number, a verification action is performed to judge whether the storage state of any memory cell in the selected row is close to the M-th storage state according to the first ratio. According to the judging result, the number of times of performing the successive write actions is determined.

In the later stage of the program procedure, a second number and a second ratio are set. The second number is 1, and the second ratio is 1. After one write action is completed, the verification action is performed to judge whether the memory cell is programmed to the M-th storage state. The above processes are repeatedly done until all memory cells are programmed to the M-th storage state.

In some embodiments, the non-volatile memory further comprises a voltage clamping circuit for fixing the reference current path and the cell current path at a specified bias voltage. Consequently, the cell current generated by the memory cell is more accurate.

Figure 10A:
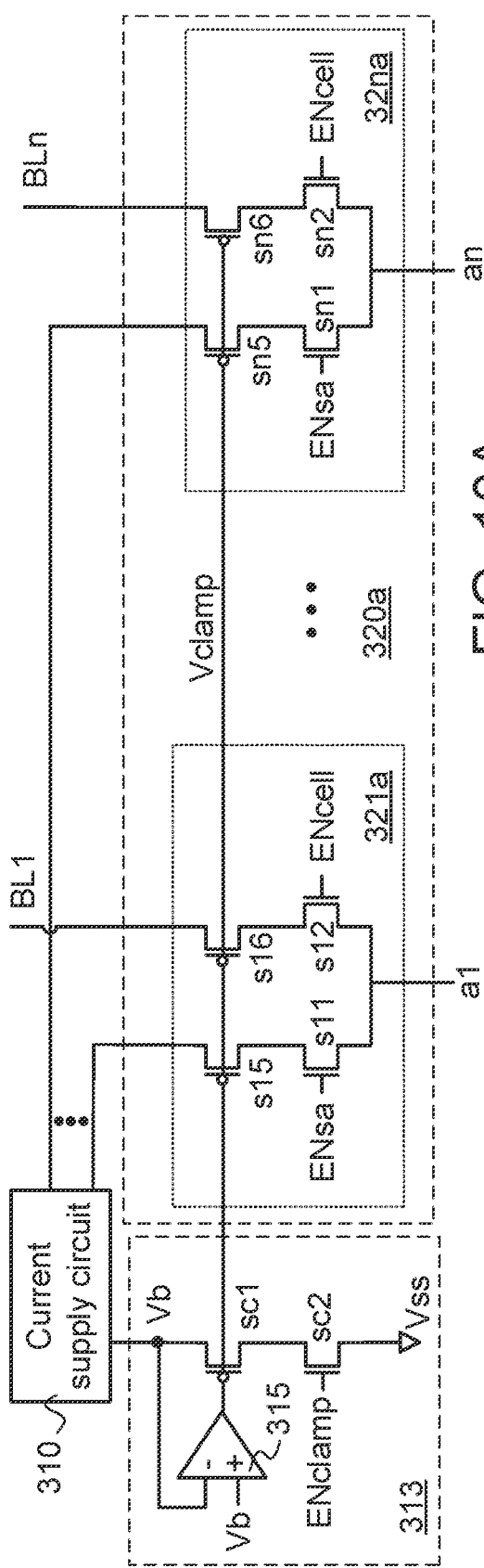
FIGS. 10A and 10B are schematic circuit diagrams illustrating two examples of a path selecting circuit with a voltage clamping circuit.
Figure 10B:
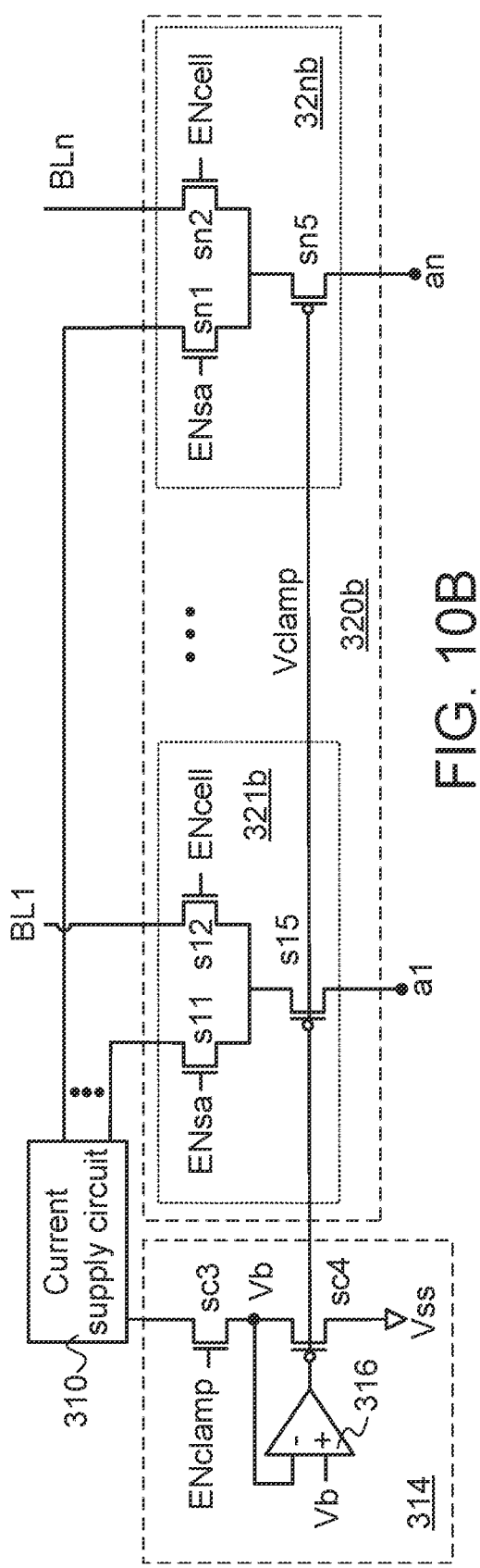

FIGS. 10A and 10B are schematic circuit diagrams illustrating two examples of a path selecting circuit with a voltage clamping circuit.

As shown in FIG. 10A, the path selecting circuit 320a comprises n path selectors 321a~32na and a voltage clamping circuit 313. The structures of the path selectors 321a~32na are identical. Consequently, only the path selector 321a will be described as follows.

The reference current path of the path selector 321a comprises a switching transistor s11 and a control transistor s15. The first source/drain terminal of the control transistor s15 is connected with the current supply circuit 310. The gate terminal of the control transistor s15 receives a clamp voltage Vclamp. The first source/drain terminal of the switching transistor s11 is connected with a second source/drain terminal of the control transistor s15. The second source/drain terminal of the switching transistor s11 is connected with the node a1. The gate terminal of the switching transistor s11 receives the reference current enable signal ENsa.

The cell current path of the path selector 321a comprises a switching transistor s12 and a control transistor s16. The first source/drain terminal of the control transistor s16 is connected with the bit line BL1. The gate terminal of the control transistor s16 receives the clamp voltage Vclamp. The first source/drain terminal of the switching transistor s12 is connected with the second source/drain terminal of the control transistor s16. The second source/drain terminal of the switching transistor s12 is connected with the node a1. The gate terminal of the switching transistor s12 receives the cell current enable signal ENcell.

The voltage clamping circuit 313 comprises an operation amplifier 315, a switching transistor sc2 and a control transistor sc1. The positive input terminal of the operation amplifier 315 receives a bias voltage Vb. The negative input terminal of the operation amplifier 315 is connected with the first source/drain terminal of the control transistor sc1. The output terminal of the operation amplifier 315 generates the clamp voltage Vclamp. The first source/drain terminal of the control transistor sc1 is also connected with the current supply circuit 310. The gate terminal of the control transistor sc1 is connected with the output terminal of the operation amplifier 315. The first source/drain terminal of the switching transistor sc2 is connected with the second source/drain terminal of the control transistor sc1. The second source/drain terminal of the switching transistor sc2 receives a supply voltage Vss. The gate terminal of the switching transistor sc2 receives a clamp enable signal ENclamp.

When the path selecting circuit 320a is enabled, the clamp enable signal ENclamp is activated. Consequently, the negative input terminal of the operation amplifier 315 of the voltage clamping circuit 313 is fixed at the bias voltage Vb. The difference between the bias voltage Vb and the clamp voltage Vclamp is equal to the magnitude of a threshold voltage Vt of the control transistor sc1. That is, Vb=Vclamp+Vt. Similarly, the gate terminals of the other control transistors s15~sn5 and s16~sn6 of the path selecting circuit 320a receive the clamp voltage Vclamp. Consequently, the first source/drain terminals of the control transistors s15~sn5 and s16~sn6 are fixed at the bias voltage Vb.

As shown in FIG. 10B, the path selecting circuit 320b comprises n path selectors 321b~32nb and a voltage clamping circuit 314. The structures of the path selectors 321b~32nb are identical. Consequently, only the path selector 321b will be described as follows.

The reference current path of the path selector 321b comprises a switching transistor s11 and a control transistor s15. The first source/drain terminal of the switching transistor s11 is connected with the current supply circuit 310. The gate terminal of the switching transistor s11 receives the reference current enable signal ENsa. The first source/drain terminal of the control transistor s15 is connected with the second source/drain terminal of the switching transistor s11. The second source/drain terminal of the control transistor s15 is connected with the node a1. The gate terminal of the control transistor s15 receives a clamp voltage Vclamp.

The cell current path of the path selector 321b comprises a switching transistor s12 and the control transistor s15. The first source/drain terminal of the switching transistor s12 is connected with the bit line BL1. The second source/drain terminal of the switching transistor s12 is connected with the first source/drain terminal of the control transistor s15. The gate terminal of the switching transistor s12 receives the cell current enable signal ENcell.

The voltage clamping circuit 314 comprises an operation amplifier 316, a switching transistor sc3 and a control transistor sc4. The positive input terminal of the operation amplifier 316 receives a bias voltage Vb. the negative input terminal of the operation amplifier 316 is connected with the first source/drain terminal of the control transistor sc4. The output terminal of the operation amplifier 316 generates the clamp voltage Vclamp. The first source/drain terminal of the switching transistor sc3 is connected with the current supply circuit 310. The gate terminal of the switching transistor sc3 receives a clamp enable signal ENclamp. The first source/drain terminal of the control transistor sc4 is connected with the second source/drain terminal of the switching transistor sc3. The second source/drain terminal of the control transistor sc4 is connected with a supply voltage Vss. The gate terminal of the control transistor sc4 is connected with the output terminal of the operation amplifier 316.

When the path selecting circuit 320b is enabled, the clamp enable signal ENclamp is activated. Consequently, the negative input terminal of the operation amplifier 316 of the voltage clamping circuit 314 is fixed at the bias voltage Vb. The difference between the bias voltage Vb and the clamp voltage Vclamp is equal to the magnitude of a threshold voltage Vt of the control transistor sc4. That is, Vb=Vclamp+Vt. Similarly, the gate terminals of the other control transistors s15~sn5 of the path selecting circuit 320b receive the clamp voltage Vclamp. Consequently, the first source/drain terminals of the control transistors s15~sn5 are fixed at the bias voltage Vb.

Figure 11:
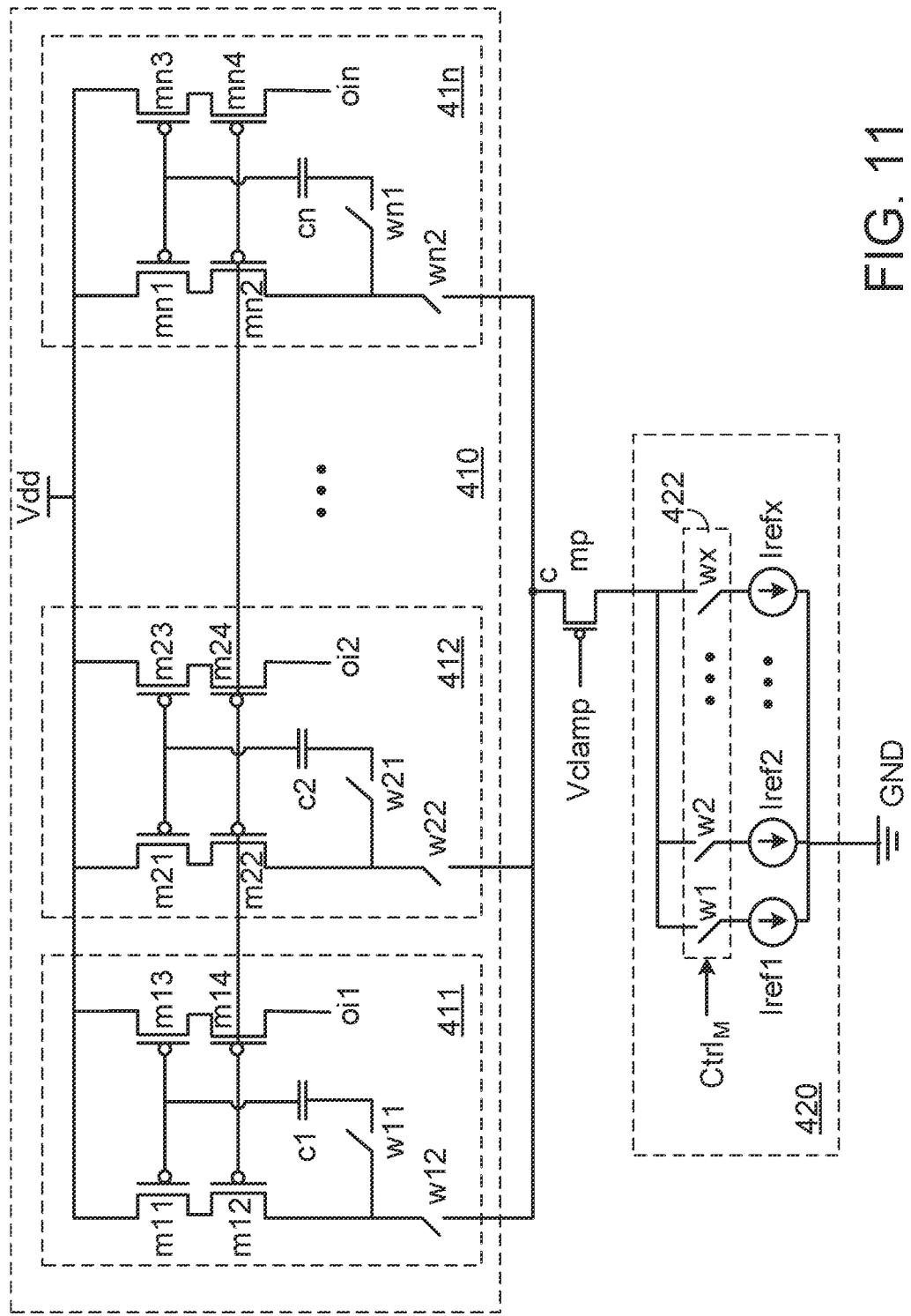
FIG. 11 is a schematic circuit diagram illustrating the detailed structures of another exemplary current supply circuit of the non-volatile memory as shown in FIG. 3.

In another embodiment, the current supply circuit 310 receives the clamp voltage Vclamp from the voltage clamping circuit 313 or the voltage clamping circuit 314. FIG. 11 is a schematic circuit diagram illustrating the detailed structures of another exemplary current supply circuit of the non-volatile memory as shown in FIG. 3. In comparison with the embodiment of FIG. 4A, the current supply circuit 310 further comprises a transistor mp between the node c and the current generator 420. The first source/drain terminal of the transistor mp is connected with the node c. The second source/drain terminal of the transistor mp is connected with the current generator 420. The gate terminal of the transistor mp receives the clamp voltage Vclamp.

From the above descriptions, the present invention provides a non-volatile memory with a multi-level cell array and an associated program control method. During the program cycle, the write action and the verification action are continuously performed many times. After the program cycle, all memory cells of the selected row reach the target storage states and generate the corresponding cell currents.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
a cell array comprising plural multi-level memory cells in an m×n array, wherein the cell array is connected with m word lines and n bit lines, and each of the plural multi-level memory cells is in one of X storage states, wherein X is larger than or equal to 4;
a current supply circuit;
a path selecting circuit connected with the current supply circuit and the n bit lines, wherein the path selecting circuit comprises n path selectors, and the n path selectors are connected with the current supply circuit and the corresponding n bit lines;

a verification circuit connected with the path selecting circuit, and comprising n verification devices, wherein the n verification devices are connected with the corresponding n path selectors and generate n verification signals; and a control circuit receiving the n verification signals, wherein during a sample period of a verification action, the control circuit controls the current supply circuit to provide n M-th reference currents to the n verification devices through the n path selectors and convert the n M-th reference currents into n reference voltages, wherein during a verification period of the verification action, the control circuit controls the n multi-level memory cells of a selected row to generate n cell currents to the n verification devices through the n bit lines and the n path selectors and convert the n cell currents into n sensed voltages, wherein the n verification devices generate the n verification signals according to the corresponding reference voltages and the corresponding sensed voltages, wherein according to the n verification signals, the control circuit judges whether the n multi-level memory cells have reached an M-th storage state of the X storage states, wherein m, n, M and X are positive integers, and M is smaller than or equal to X.

2. The non-volatile memory as claimed in claim 1, wherein the current supply circuit comprises:

a first current copy circuit connected between a supply voltage and a node, wherein the first current copy circuit comprises n copy units between the supply voltage and the node, and the n copy units comprise n current output terminals, respectively, wherein the n current output terminal of the n copy units are connected with the corresponding path selectors; and a current generator coupled to the node, wherein the current generator selects the M-th reference current of X reference currents to the n copy units, wherein during the verification action, the first current copy circuit generates the n M-th reference currents to the n path selectors.

3. The non-volatile memory as claimed in claim 2, wherein a first copy unit of the n copy units comprises:

a first transistor, wherein a first source/drain terminal of the first transistor receives the supply voltage;

a second transistor, wherein a first source/drain terminal of the second transistor is connected with a second source/drain terminal of the first transistor;

a third transistor, wherein a first source/drain terminal of the third transistor receives the supply voltage, and a gate terminal of the third transistor is connected with the a gate terminal of the first transistor;

a fourth transistor, wherein a first source/drain terminal of the fourth transistor is connected with a second source/drain terminal of the third transistor, a gate terminal of the fourth transistor is connected with a gate terminal of the second transistor, and a second source/drain terminal of the fourth transistor is a current output terminal of the first copy unit;

a capacitor, wherein a first terminal of the capacitor is connected with the gate terminal of the first transistor;

a first switch, wherein a first terminal of the first switch is connected with a second source/drain terminal of the second transistor, and a second terminal of the first switch is connected with a second terminal of the capacitor; and a second switch, wherein a first terminal of the second switch is connected with the second source/drain terminal of the second transistor, and the second terminal of second switch is connected to the node.

4. The non-volatile memory as claimed in claim 3, wherein according to a control signal, the current generator issues the M-th reference current of the X reference currents to the node.

5. The non-volatile memory as claimed in claim 3, wherein the current supply circuit further comprises a fifth transistor, wherein a first source/drain terminal of the fifth transistor is connected to the node, a second source/drain terminal of the fifth transistor is connected with the current generator, and a gate terminal of the sixth transistor receives a clamp voltage.

6. The non-volatile memory as claimed in claim 2, wherein the current supply circuit further comprises a second current copy circuit, and the second current copy circuit comprises n copy units, wherein the n copy units are connected with the corresponding path selectors, and the current generator is connected with the n copy units of the second current copy circuit, wherein when the first current copy circuit issues the n M-th reference currents to the n path selectors, the second current copy circuit receives a (M+1)-th reference current, and the n copy units of the second current copy circuit prepare n driving voltages to output the n (M+1)-th reference currents.

7. The non-volatile memory as claimed in claim 1, wherein a first path selector of the n path selectors comprises a reference current path and a cell current path, wherein the reference current path is controlled according to a reference current enable signal, and the cell current path is controlled according to a cell current enable signal, wherein when the reference current enable signal is activated, the current supply circuit is connected with a first verification device of the n verification devices through the reference current path, wherein when the cell current enable signal is activated, the first bit line is connected with the first verification device through the cell current path.

8. The non-volatile memory as claimed in claim 7, wherein the reference current path comprises a first switching transistor, and the cell current path comprises a second switching transistor, wherein a first source/drain terminal of the first switching transistor is connected with the current supply circuit, a second source/drain terminal of the first switching transistor is connected with the first verification device, a gate terminal of the first switching transistor receives the reference current enable signal, a first source/drain terminal of the second switching transistor is connected with the first bit line, a second source/drain terminal of the second switching transistor is connected with the first verification device, and a gate terminal of the second switching transistor receives the current enable signal.

9. The non-volatile memory as claimed in claim 7, wherein the non-volatile memory further comprises a voltage clamping circuit, and the voltage clamping circuit is connected with the current supply circuit and the path selecting circuit, wherein the voltage clamping circuit provides a clamp voltage to the path selecting circuit, so that the reference current path and the cell current path of the first path selector are fixed at a bias voltage.

10. The non-volatile memory as claimed in claim 9, wherein the reference current path comprises a first switching transistor and a first control transistor, the cell current path comprises a second switching transistor and a second control transistor, and the voltage clamping circuit comprises an operation amplifier, a third switching transistor and a third control transistor, wherein a first input terminal of the operation amplifier receives the bias voltage, a second input terminal of the operation amplifier is connected with a first source/drain terminal of the third control transistor, an output terminal of the operation amplifier generates the clamp voltage, a first source/drain terminal of the third control transistor is connected with the current supply circuit, a gate terminal of the third control transistor is connected with the output terminal of the operation amplifier, a first source/drain terminal of the third switching transistor is connected with a second source/drain terminal of the third control transistor, a second source/drain terminal of the third switching transistor receives a supply voltage, and a gate terminal of the third switching transistor receives a clamp enable signal, wherein a first source/drain terminal of the first control transistor is connected with the current supply circuit, a gate terminal of the first control transistor is connected with the output terminal of the operation amplifier, a first source/drain terminal of the first switching transistor is connected with a second source/drain terminal of the first control transistor, a second source/drain terminal of the first switching transistor is connected with the first verification device, and a gate terminal of the first switching transistor receives the reference current enable signal, wherein a first source/drain terminal of the second control transistor is connected with the first bit line, a gate terminal of the second control transistor is connected with the output terminal of the operation amplifier, a first source/drain terminal of the second switching transistor is connected with a second source/drain terminal of the second control transistor, a second source/drain terminal of the second switching transistor is connected with the first verification device, and a gate terminal of the second switching transistor receives the cell current enable signal.

11. The non-volatile memory as claimed in claim 9, wherein the reference current path comprises a first switching transistor and a first control transistor, the cell current path of the path selector comprises a second switching transistor and the first control transistor, and the voltage clamping circuit comprises an operation amplifier, a third switching transistor and a second control transistor, wherein a first input terminal of the operation amplifier receives the bias voltage, a second input terminal of the operation amplifier is connected with a first source/drain terminal of the second control transistor, an output terminal of the operation amplifier generates the clamp voltage, a first source/drain terminal of the third switching transistor is connected with the current supply circuit, a gate terminal of the third switching transistor receives a clamp enable signal, a first source/drain terminal of the second control transistor is connected with a second source/drain terminal of the third switching transistor, a second source/drain terminal of the second control transistor is connected with a supply voltage, and a gate terminal of the second control transistor is connected with the output terminal of the operation amplifier, wherein a first source/drain terminal of the first switching transistor is connected with the current supply circuit, a gate terminal of the first switching transistor receives the reference current enable signal, a first source/drain terminal of the first control transistor is connected with a second source/drain terminal of the first switching transistor, a second source/drain terminal of the first control transistor is connected with the first verification device, and a gate terminal of the first control transistor is connected with the output terminal of the operation amplifier, wherein a first source/drain terminal of the second switching transistor is connected with the first bit line, a gate terminal of the second switching transistor receives the cell current enable signal, and a second source/drain terminal of the second switching transistor is connected with the first source/drain terminal of the first control transistor.

12. The non-volatile memory as claimed in claim 7, wherein the first verification device comprises:
an operation amplifier, wherein a first input terminal of the operation amplifier is connected with the first path selector, and an output terminal of the operation amplifier generates the first verification signal;
a first switch, wherein a first terminal of the first switch is connected with the first input terminal of the operation amplifier, a second terminal of the first switch is connected with a ground terminal, and a control terminal of the first switch receives a discharge enable signal;
a second switch, wherein a first terminal of the second switch is connected with the output terminal of the operation amplifier, a second terminal of the second switch is connected with a second input terminal of the operation amplifier, and a control terminal of the second switch receives a close-loop enable signal;
a first capacitor, wherein a first terminal of the first capacitor is connected with the first input terminal of the operation amplifier, and a second terminal of the first capacitor is connected with the ground terminal; and
a second capacitor, wherein a first terminal of the second capacitor is connected with the second input terminal of the operation amplifier, and a second terminal of the second capacitor is connected with the ground terminal.

13. The non-volatile memory as claimed in claim 12, wherein during a reference current sampling phase of the verification action, the first capacitor is charged to the first reference voltage by the M-th reference current and the close-loop enable signal is activated, so that the first reference voltage is duplicated to the second capacitor by the operation amplifier, wherein during a cell current sampling phase of the verification action, the first capacitor is charged to the first sensed voltage by the first cell current, wherein according to the first reference voltage and the first sensed voltage, the operation amplifier generates a first verification signal of the n verification signals.

14. The non-volatile memory as claimed in claim 13, wherein in a discharge period of the reference current sampling phase and a discharge period of the cell current sampling phase, the discharge enable signal is enabled, so that the first capacitor is discharged to a ground voltage.

15. A program control method for the non-volatile memory according to claim 1, the program control method comprising steps of:
determining a selected row of the cell array, and starting a program cycle of the selected row;
setting M as 1;
(a) the current supply circuit providing the n M-th reference currents to the path selecting circuit;
(b) allowing the memory cells in the selecting row which have reached the target storage states to undergo a program inhibition action;
(c) performing a M-th program procedure on the memory cells of the selected row which have not reached the target storage states to a M-th storage state, and
(d) judging whether M is equal to X, when all of the programmed memory cells in step (c) have reached the M-th storage state, wherein if M is not equal to X, adding 1 to M and performing the step (a) again; else, ending the program cycle.

16. The program control method as claimed in claim 15, wherein the M-th program procedure comprises steps of:
- (c1) setting a first number and a first ratio, wherein the first number is a positive integer, and the first ratio is larger than 0 and smaller than or equal to 1;
- (c2) allowing the memory cells which having reached the M-th storage state to undergo a program inhibition action;
- (c3) allowing the memory cells which having not reached the M-th storage states to undergo the first number of write actions;
- (c4) judging whether a cell current of any of the programmed memory cells reaches a product of the first ratio and the M-th reference current;
- (c5) if a judging condition of the step (c4) is not satisfied, performing the step (c3) again;
- (c6) if the judging condition of the step (c4) is satisfied, judging whether both of the first number and the first ratio are not 1;
- (c7) if both of the first number and the first ratio are not 1, decreasing the first number and increasing the first ratio, and then performing the step (c2) again;
- (c8) if both of the first number and the first ratio are 1, judging whether all of the programmed memory cell reach the M-storage state;
- (c9) if a judging condition of the step (c8) is not satisfied, performing the step (c2) again; and
- (c10) if the judging condition of the step (c8) is satisfied, ending the M-th program procedure.

17. The program control method as claimed in claim 16, wherein a ratio of the sample period to the verification period is equal to the first ratio.

18. The program control method as claimed in claim 16, wherein in the step (c7), the first number is decreased and the first ratio is increased according to a look-up table.

* * * * *